(12) United States Patent
Inoue et al.

(10) Patent No.: US 7,683,736 B2
(45) Date of Patent: Mar. 23, 2010

(54) RESONANT CIRCUIT, FILTER, AND ANTENNA DUPLEXER

(75) Inventors: Shogo Inoue, Kawasaki (JP); Tokihiro Nishihara, Kawasaki (JP); Takashi Matsuda, Kawasaki (JP); Mosanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 232 days.

(21) Appl. No.: 11/493,655

(22) Filed: Jul. 27, 2006

(65) Prior Publication Data
US 2007/0024392 A1   Feb. 1, 2007

(30) Foreign Application Priority Data
Jul. 28, 2005  (JP) .............................. 2005-219254

(51) Int. Cl.
H03H 9/70  (2006.01)
H03H 9/72  (2006.01)

(52) U.S. Cl. .................... 333/133; 333/132; 333/129

(58) Field of Classification Search .................. 333/133, 333/193, 195, 187, 189, 129, 132
See application file for complete search history.

(56) References Cited

U.S. PATENT DOCUMENTS

| | | | |
|---|---|---|---|
| 2,222,417 A | | 11/1940 | Mason |
| 5,077,545 A | * | 12/1991 | Gopani et al. ............... 333/195 |
| 5,933,062 A | * | 8/1999 | Kommrusch ................. 333/193 |
| 6,201,457 B1 | * | 3/2001 | Hickernell .................... 333/193 |
| 6,472,954 B1 | * | 10/2002 | Ruby et al. ................... 333/133 |
| 6,924,583 B2 | * | 8/2005 | Lin et al. ..................... 310/324 |
| 7,030,718 B1 | * | 4/2006 | Scherer ....................... 333/188 |
| 2004/0058664 A1 | | 3/2004 | Yamamoto et al. |
| 2004/0119561 A1 | | 6/2004 | Omote |
| 2004/0130410 A1 | | 7/2004 | Nishimura et al. |
| 2008/0136555 A1 | | 6/2008 | Schmidhammer |

FOREIGN PATENT DOCUMENTS

| | | |
|---|---|---|
| EP | 0 877 491 A1 | 11/1998 |
| JP | 6-152317 | 5/1994 |
| JP | 08-065089 | * 3/1996 |
| JP | 2001-44790 | 2/2001 |
| JP | 2002-223147 | 8/2002 |
| JP | 2002-299997 | * 10/2002 |
| JP | 2003-069382 A | 3/2003 |
| JP | 2003-332885 A | 11/2003 |
| JP | 2004-135322 A | 4/2004 |

(Continued)

OTHER PUBLICATIONS

S.V. Kiselev, et al.; "Saw Filters with Combined Single-Mode and Double-Mode Sections"; 2002 IEEE Ultrasonics Symposium; pp. 179-183 of vol. 1, Oct. 11, 2002.

(Continued)

*Primary Examiner*—Barbara Summons
(74) *Attorney, Agent, or Firm*—Arent Fox LLP

(57) ABSTRACT

There is provided a resonant circuit includes a resonator, an inductor connected in parallel with the resonator, and a capacitor connected in parallel with the resonator. There are also provided a filter and an antenna duplexer having the above-described resonant circuit.

9 Claims, 31 Drawing Sheets

FOREIGN PATENT DOCUMENTS

| | | | |
|---|---|---|---|
| JP | 2004-140738 | * | 5/2004 |
| JP | 2004 173245 | | 6/2004 |
| JP | 2004-242281 A | | 8/2004 |
| JP | 2006-157174 | * | 6/2006 |
| WO | 99/23757 | | 5/1999 |
| WO | WO 2004/047290 | | 3/2004 |
| WO | WO 2006/048096 A1 | | 5/2006 |

OTHER PUBLICATIONS

Onzuka T et al., "SAW Duplexers without $\lambda/4$ Phase Shifter for PDC Cellular Phone Systems" NRS Technologies, Inic., Kawasaki 213-0012, Japan; 2003 IEEE Ultrasonics Symposium.

* cited by examiner

PRIOR ART

RESONANT CIRCUIT, FILTER, AND ANTENNA DUPLEXER

BACKGROUND OF THE INVENTION

1. Field of the Invention

This invention generally relates to resonant circuits, filters, and antenna duplexers, and more particularly, to a resonant circuit, filter, and antenna duplexer, in which an inductor and capacitor are connected in parallel with a resonator.

2. Description of the Related Art

In recent years, mobile telephones and mobile information terminals have become widespread rapidly, with the advancements of mobile communications systems. For example, the mobile telephone terminals communicate at high-frequency bands such as 800 MHz to 1.0 GHz and 1.5 GHz to 2.0 GHz. A device for the mobile communications system often employs a high-frequency filter having a resonant circuit or antenna duplexer having the high-frequency filter.

Referring to FIG. 1A, the resonant circuit used in the above-described device forms a one-port resonant circuit, in which a resonator S21 is arranged between an input terminal In and an output terminal Out. A Surface Acoustic Wave (SAW) resonator or Film Bulk Acoustic Resonator (FBAR) is employed as a resonator. FIG. 1B is a top view of a SAW resonator. Mounted on a piezoelectric substrate 70 are: comb-like electrodes IDT (Interdigital Transducer) respectively connected to the input terminal In and the output terminal Out; and reflectors R0 provided at both sides of the comb-like electrodes IDT. The comb-like electrodes IDT and the reflectors R0 are made of a metal such as aluminum (Al), for example. Here, in the accompanying drawings, it is shown that the reflectors R0 and the IDT have electrode fingers less than the actual number of the fingers.

FIG. 1C is a top view of FBAR. FIG. 1D is a cross-sectional view thereof. A lower electrode 75, a piezoelectric film 74, and an upper electrode 73 are deposited on an opening 76 in a substrate 72 (an example is a silicon substrate). Aluminum nitride, for example, is used for the piezoelectric film 74. Instead of the opening 76, a multilayer reflection film is provided in some cases.

A ladder type filter, in which one-port resonant circuits are connected in series and in parallel, is used for a high-frequency filter. FIG. 2 shows a configuration of the ladder type filer. Between the input terminal In and the output terminal Out, series resonators S11 and S12 are connected in series and parallel resonators P11 and P12 are connected in parallel. Referring to FIG. 3A through FIG. 4B, the operation principle of the ladder type filter will be described. The ladder type filter can be separated into series resonant circuits and parallel resonant circuits. Referring to FIG. 3A, in a series resonant circuit, assuming that a resonator S21 is a one-port resonant circuit, one of two signal terminals is set to the input terminal In and the other terminal is set to the output terminal Out. Referring to FIG. 3B, in a parallel resonant circuit, assuming that a resonator P21 is a one-port resonant circuit, one of the two signal terminals is connected to a ground terminal and the other terminal is connected to a short-circuit line.

FIG. 3C shows passband characteristic from the input terminal In to the output terminal Out of the series resonant circuit and parallel resonant circuit. The horizontal axis represents frequency, and the vertical axis represents band-pass amount. The passband characteristic of the series resonant circuit is indicated by a solid line, and that of the parallel resonant circuit is indicated by a dashed line. The passband characteristic of the series resonant circuit includes one resonance point (resonance frequency) $f_{rs}$ and one antiresonance point (antiresonance frequency) $f_{as}$. The passband amount is the highest at the one resonance point $f_{rs}$, and is the lowest at the one antiresonance point $f_{as}$. On the other hand, the passband characteristic of the parallel resonant circuit includes one resonance point $f_{rp}$ and one antiresonance point $f_{ap}$. The passband amount becomes the lowest at the one resonance point $f_{rp}$, and becomes the highest at the one antiresonance point $f_{ap}$.

FIG. 4A shows a structure of a one-stage ladder type filter. Referring to FIG. 4A, a series resonator S22 serving as a series resonant circuit is connected in series between the input terminal In and the output terminal Out, and a parallel resonator P22 serving as a parallel resonant circuit is connected between the output terminal Out and the ground terminal. At this point, it is designed that the resonance point $f_{rs}$ of the series resonant circuit is substantially identical to the antiresonance point $f_{ap}$ of the parallel resonant circuit. FIG. 4B shows passband characteristic from the input terminal In to the output terminal Out of the one-stage ladder type filter. The horizontal axis represents frequency, and the vertical axis represents band-pass amount. With the structure shown in FIG. 4A, the passband characteristic of the series resonant circuit and that of the parallel resonant circuit are combined, and the passband characteristic of FIG. 4B is obtainable. The band-pass amount is the highest around the resonance point $f_{rs}$ of the series resonant circuit and the antiresonance point $f_{ap}$ of the parallel resonant circuit, and is the lowest at the antiresonance point $f_{ap}$ of the series resonant circuit and the resonance point $f_{rp}$ of the parallel resonant circuit. The passband is a frequency range that ranges from the resonance point $f_{rp}$ of the parallel resonant circuit to the antiresonance point $f_{ap}$ of the series resonant circuit, and the attenuation range is the frequency range equal to or lower than the resonance point $f_{rp}$ of the parallel resonant circuit and equal to or higher than the antiresonance point $f_{ap}$ of the series resonant circuit. In this manner, the ladder type filer functions as a band-pass filter.

There has been proposed an antenna duplexer with the use of a filter having the above-described resonator. The antenna duplexer employs two band-pass filters to arrange a transmit filter between the transmitting terminal and the antenna terminal and arrange a receive filter between the receiving terminal and the antenna terminal. A matching circuit (for example, phase shifter) is also arranged between the antenna terminal and the transmit filter or between the antenna terminal and the receive filter. The antenna duplexer has functions of outputting a transmitting signal input from the transmitting terminal, from the antenna terminal, and outputting a received signal input from the antenna terminal, from the receiving terminal.

A description is given of the functions of the matching circuit in a case, for example, where the matching circuit is arranged between the antenna terminal and the receive filter. The matching circuit has functions of preventing the electricity of the transmitting signal input from the transmit terminal from entering the receive filter, and outputting the transmitting signal from the antenna terminal. Generally, the impedance equals almost zero at the receive filter in the frequency band of the transmitting signal. Therefore, a large part of the electricity of the transmitting signal enters the receive filter. So, the matching circuit is provided to convert the impedance in the frequency band of the transmitting signal at the receive filter into almost infinite.

As disclosed in Japanese Patent application Publication No. 2003-332885, Japanese Patent application Publication No. 2003-69382, Japanese Patent application Publication No. 2004-135322, and Japanese Patent application Publication No. 2004-242281, there has been proposed the ladder type filter in which an inductor is connected in parallel with a resonator. FIG. 5 shows a conventional filter according to the above-described conventional techniques. The series resonators S11 and S12 are connected in series between the input terminal In and the output terminal Out, and the parallel resonator P11 is connected between nodes of the resonators S11 and S12 and the ground. The parallel resonator P12 is connected between the output terminal Out and the ground. In addition, inductors L11 and L12 are respectively connected in parallel with the series resonators S11 and S12. With such configuration, two antiresonance points of the series resonant circuits are obtainable. Thus, with the use of the two antiresonance points, it is possible to provide a filter of excellent attenuation properties.

The filter that includes a SAW resonator or FBAR serving as a resonator has similar functions (double resonance characteristic) with the resonance point and antiresonance point, which has been explained with reference to FIG. 3A through FIG. 4B. Herein, "resonator" simply denotes the resonator having the double resonance characteristic such as the SAW resonator or FBAR. Also, "resonant circuit (one-port resonant circuit)" denotes a circuit that includes a single resonator or a resonator with which an inductor or capacitor is connected in parallel.

In the conventional techniques, however, the inductor connected in parallel with the resonator has a large size, and this causes a problem that the sizes of the filter and the duplexer cannot be reduced. In addition, two antiresonance points cannot be arbitrarily set. For these reasons, there is another problem in that design flexibility is degraded in the filter that utilizes the two antiresonance points.

SUMMARY OF THE INVENTION

The present invention has been made in view of the above circumstances and provides a resonant circuit, a filter, and an antenna duplexer, in which the size can be reduced and the design flexibility can be improved.

According to one aspect of the present invention, preferably, there is provided a resonant circuit includes: a resonator; an inductor connected in parallel with the resonator; and a capacitor connected in parallel with the resonator.

According to another aspect of the present invention, preferably, there is provided a ladder type filter including: one or more series resonant circuits; and one or more parallel resonant circuits. At least one of the one or more series resonant circuits and the one or more parallel resonant circuits includes the above-described resonant circuit.

According to still another aspect of the present invention, preferably, there is provided a surface acoustic wave filter including: a multi-mode surface acoustic wave filter; and the above-described resonant circuit that.

According to yet another aspect of the present invention, preferably, there is provided an antenna duplexer including: an antenna terminal; a first filter connected to the antenna terminal; and a second filter connected to the antenna terminal. At least one of the first filter and the second filter is the above-described ladder type filter.

BRIEF DESCRIPTION OF THE DRAWINGS

Preferred embodiments of the present invention will be described in detail with reference to the following drawings, wherein.

DESCRIPTION OF THE PREFERRED EMBODIMENTS

Figure 1A:
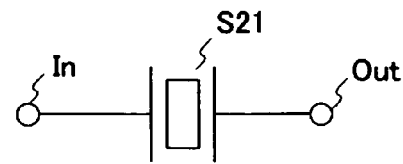
FIG. 1A shows a resonator.
Figure 1B:
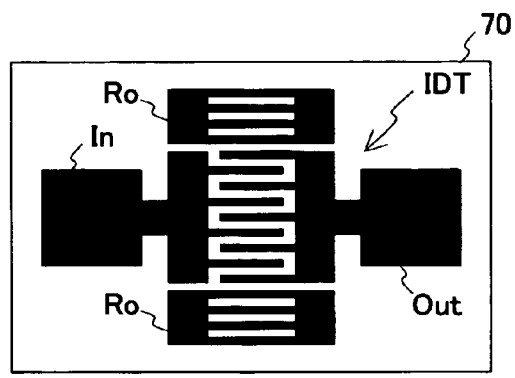
FIG. 1B is a top view of a SAW resonator.
Figure 6A:
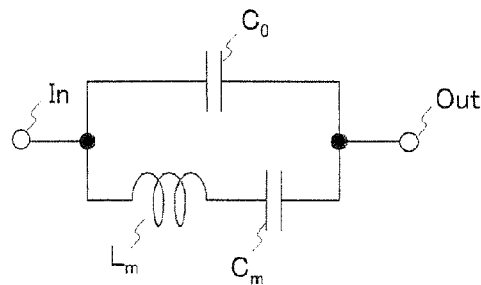
FIG. 6A shows an equivalent circuit.

Firstly, a description will be given the mechanism that can improve the attenuation characteristic according to the conventional technique. A resonance point $\omega_r$ and an antiresonance point $\omega_a$ of a resonator will now be described. FIG. 6A shows an equivalent circuit (double-resonance model) of the resonator shown in FIG. 1A. In the description hereinafter, the code of a capacitor (an example is C0) is used as a capacitance of the capacitor. The code of an inductor is used in the same manner. Referring to FIG. 6A, between the input terminal In and the output terminal Out, a capacitor C0 of the resonator is connected in parallel with an inductor Lm connected in series with a capacitor Cm. Here, the capacitance C0 corresponds to the electrostatic capacitance of the IDT in the SAW resonator, and corresponds to that between the upper electrode and the lower electrode in the FBAR. Lm and Cm are parameters that determine the resonance frequency and antiresonance frequency.

In the equivalent circuit shown in FIG. 6A, a resonance frequency $f_r$ is a frequency in which an impedance Z equals zero between the input terminal In and the output terminal Out, and an antiresonance frequency $f_a$ is a frequency in which an admittance Y equals zero. Also, the resonance angular frequency $\omega_r=2\pi f_r$, and the antiresonance angular frequency $\omega_a=2\pi f_a$. By solving Z=0 and Y=0, the resonance angular frequency $\omega_r$ and the antiresonance angular frequency $\omega_a$ in Expression 1 are obtainable.

(Expression 1)

$$\omega_r = \frac{1}{\sqrt{L_m C_m}}, \omega_a = \sqrt{\frac{1}{L_m C_m}\left(\frac{C_m + C_0}{C_0}\right)}$$

Here, it is assumed that the resonance angular frequency $\omega_r$ and the antiresonance angular frequency $\omega_a$ are fixed at given values respectively. By solving Expression 1, Lm and Cm can be described as functions in Expression 2.

(Expression 2)

$$L_m(C_0) = \frac{1}{C_0(\omega_a^2 - \omega_r^2)}, C_m(C_0) = \frac{C_0(\omega_a^2 - \omega_r^2)}{\omega_r^2}$$

Figure 6B:
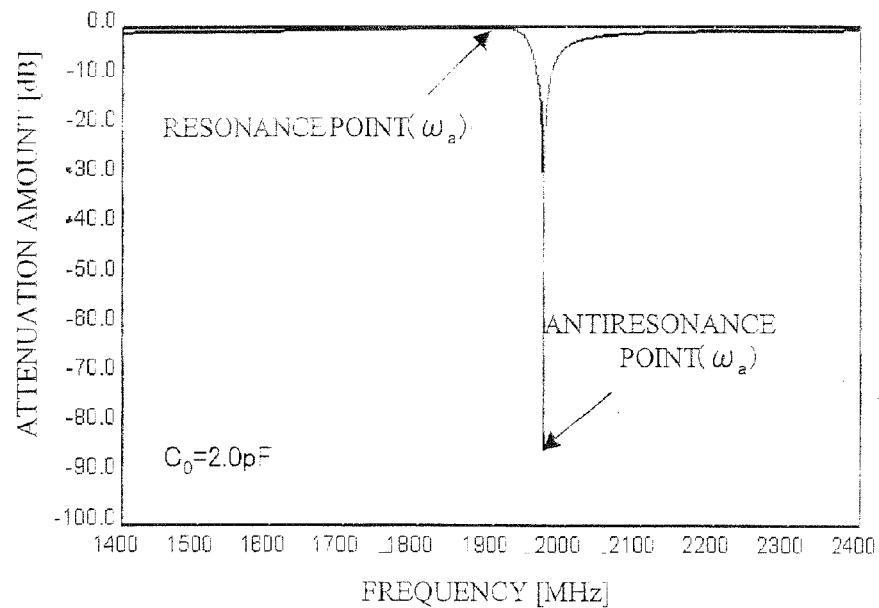
FIG. 6B shows passband characteristic of the resonator.

FIG. 6B is a view showing the attenuation amount with respect to the frequency of the resonator, which is calculated by use of the equivalent circuit shown in FIG. 6A and Expression 2. Here, the resonance frequency $f_r$ is set to 1900 MHz, the antiresonance frequency $f_a$ is set to 1970 MHz, and C0 is set to 2.0 pF. Referring to FIG. 6B, the attenuation amount is the lowest at the resonance point $f_r$ ($\omega_r$) and the highest at the resonance point $f_a$ ($\omega_a$).

Figure 7A:
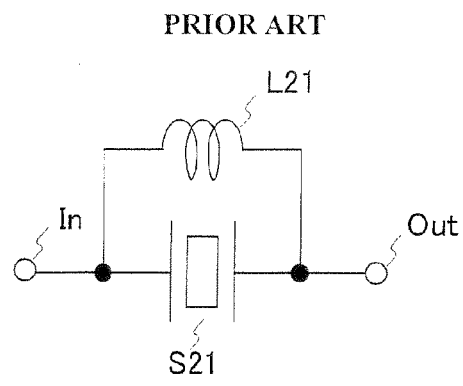
FIG. 7A shows a structure of a conventional resonant circuit.
Figure 7B:
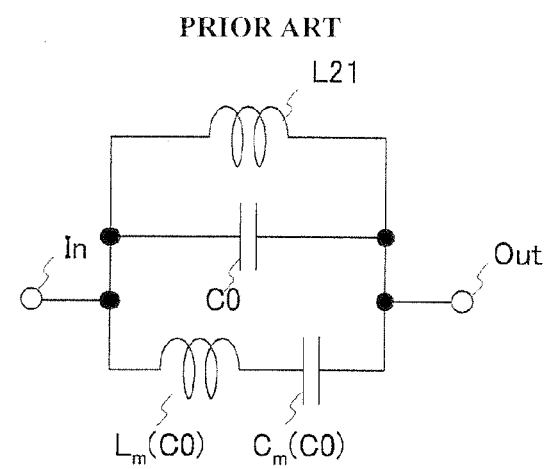
FIG. 7B shows an equivalent circuit of the conventional resonant circuit.

Next, a description is given of a conventional resonant circuit in which an inductor is connected in parallel with a resonator. FIG. 7A shows a structure of the resonant circuit. FIG. 7B shows an equivalent circuit thereof. Referring to FIG. 7A, an inductor L21 is connected in parallel with the resonator S21 arranged between the input terminal In and the output terminal Out. Referring to FIG. 7B, the inductance L21 is connected in parallel with the equivalent circuit of the resonator shown in FIG. 6A. With the use of the equivalent circuit, Expression 3 is obtained by calculating a resonance angular frequency $\omega'_r$ when the impedance Z is zero. In the case mentioned above, resonance angular frequency $\omega'_r$ equals the resonance angular frequency $\omega_r$, where a single resonator is used.

(Expression 3)

$$\omega'_r = \omega_r$$

Meanwhile, when the antiresonance angular frequency where the admittance Y equals zero is calculated, two antiresonance angular frequencies of antiresonance points $1\omega'_{a1}$ and $2\omega'_{a2}$ are obtainable, as described in Expression 4 and Expression 5.

(Expression 4)

$$\omega'_{a1} = \sqrt{\frac{1 + C_0 L_{21}\omega_a^2 - \sqrt{(1 + C_0 L_{21}\omega_a^2)^2 - 4C_0 L_{21}\omega_r^2}}{2C_0 L_{21}}}$$

(Expression 5)

$$\omega'_{a2} = \sqrt{\frac{1 + C_0 L_{21}\omega_a^2 + \sqrt{(1 + C_0 L_{21}\omega_a^2)^2 - 4C_0 L_{21}\omega_r^2}}{2C_0 L_{21}}}$$

Figure 7C:
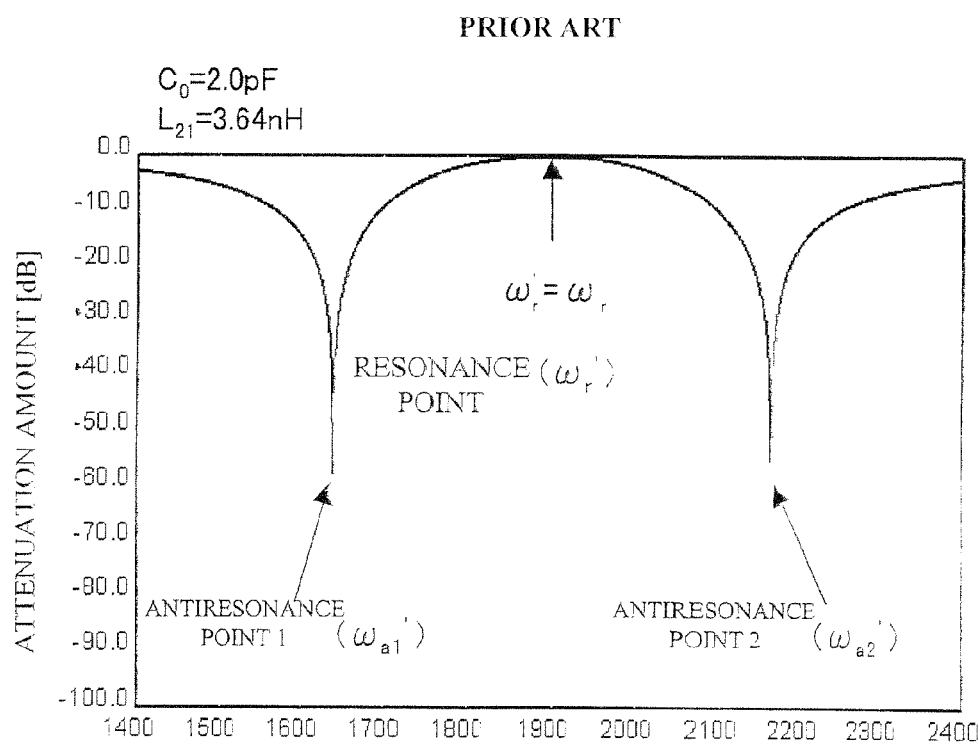
FIG. 7C is a view showing the passband characteristic of the conventional resonant circuit.

FIG. 7C is a view showing the attenuation amount calculated with the use of the equivalent circuit of FIG. 7B with respect to the frequency of the resonant circuit shown in FIG. 7A. Here, the resonance frequency $f_r$ is set to 1900 MHz, the antiresonance frequency $f_a$ is set to 1970 MHz, C0 is set to 2.0 pF, and the inductor L21 is set to 3.64 nH. Referring to FIG. 7C, the attenuation amount is the lowest at the antiresonance point $f_r$ ($\omega'_r$) and the highest at the antiresonance point $1f'_{a1}$ ($\omega'_{a1}$) and the antiresonance point $2f'_{a2}$ ($\omega'_{a2}$). That is to say, attenuation poles are the antiresonance point $1f'_{a1}$ ($\omega'_{a1}$) and the antiresonance point $2'_{a2}$ ($\omega'_{a2}$). The ladder type filter having the resonant circuit where the conventional parallel inductor is added has the purpose of improving the attenuation characteristic of the filter with the use of the antiresonance point 1 or the antiresonance point 2.

Figure 8:
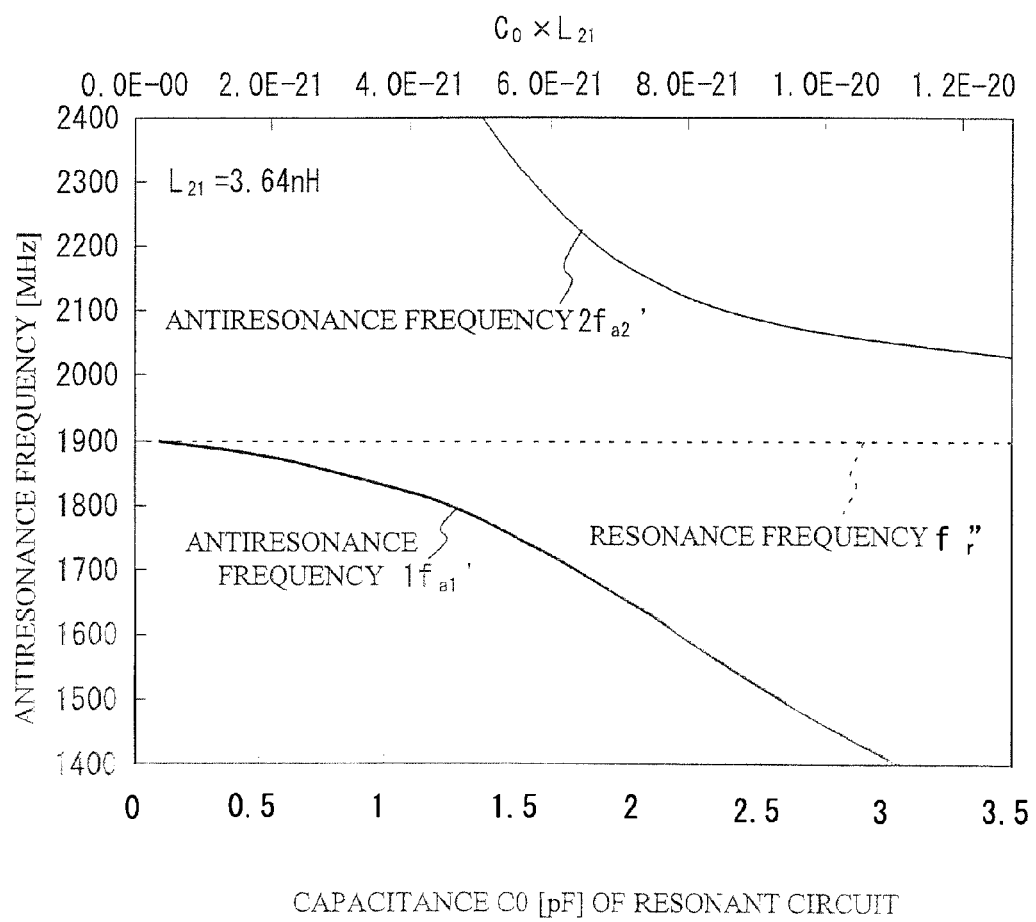
FIG. 8 is a view showing an antiresonance point and a resonance point of the conventional resonant circuit with respect to $C0$ and $C0 \times L21$.

In Expressions 4 and 5, the antiresonance point $1\omega'_{a1}$ and the antiresonance point $2\omega'_{a2}$ are determined by C0 multiplied by L21. FIG. 8 is a view showing the antiresonance point $1\omega'_{a1}$ and the resonance point $2\omega'_{a2}$ of the resonator S21 with respect to the capacitance C0, while L21 is fixed at 3.64 nH. The horizontal axis denotes C0 and C0 multiplied by L21, and the vertical axis denotes the antiresonance frequency and the resonance frequency. Referring to FIG. 8, the antiresonance point $1f'_{a1}$ and the resonance point $2f'_{a2}$ are uniquely determined by one parameter (C0×L21). Accordingly, in the filter to be designed with the use of two antiresonance points (attenuation poles), for example, if one antiresonance point is set to a desired frequency, the other antiresonance point cannot be designed to have a desired frequency value. This lowers the design flexibility.

First Embodiment

Figure 9A:
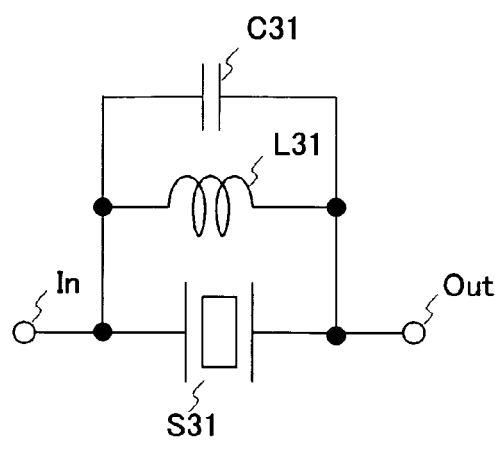
FIG. 9A is a block diagram of a resonant circuit in accordance with a first embodiment of the present invention.
Figure 9B:
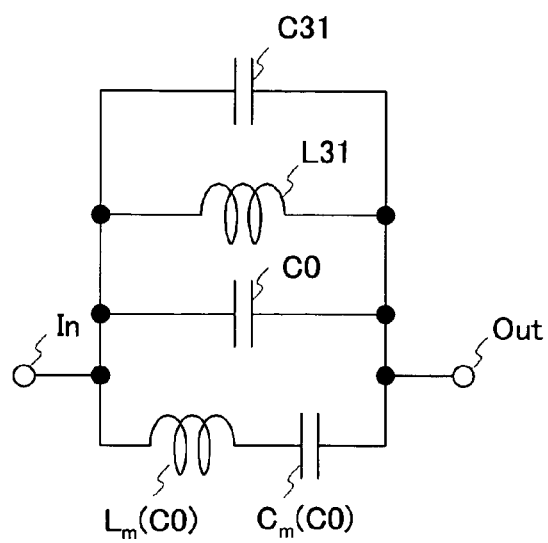
FIG. 9B is a view showing an equivalent circuit in accordance with the first embodiment of the present invention.

A description will now be given of a configuration and principle of a resonant circuit employed in a first embodiment of the present invention. FIG. 9A is a block diagram of a resonant circuit 18 in accordance with the first embodiment of the present invention. Referring to FIG. 9A, the resonant circuit used in the first embodiment includes: a resonator S31 connected between the input terminal In and the output terminal Out; an inductor L31 connected in parallel with the resonator S31; and a capacitor C31 connected in parallel with the resonator S31. FIG. 9B is an equivalent circuit (double-resonance model) of the resonant circuit 18 employed in the first embodiment. The inductance L31 and the capacitance C31 are connected in parallel in the equivalent circuit of the resonator shown in FIG. 6A. A resonance angular frequency $\omega''_r$ equals the resonance angular frequency $\omega_r$ of the resonator S31, as shown in Expression 6, where the impedance Z of the resonant circuit 18 equals zero.

(Expression 6)

$$\omega''_r = \omega_r$$

Meanwhile, when the antiresonance angular frequency where the admittance Y equals zero is calculated, two antiresonance angular frequencies having antiresonance points $1\omega''_{a1}$ and $2\omega''_{a2}$ are obtainable, as described in Expression 7 and Expression 8.

(Expression 7)

$$\omega''_{a1} = \sqrt{\frac{1 + C_0 L_{31}\omega_a^2 + C_{31}L_{31}\omega_r^2 - \sqrt{(1 + C_0 L_{31}\omega_a^2 + C_{31}L_{31}\omega_r^2)^2 - 4(C_0 L_{31} + C_{31}L_{31})\omega_r^2}}{2(C_0 L_{31} + C_1 L_{31})}}$$

(Expression 8)

$$\omega''_{a2} = \sqrt{\frac{1 + C_0 L_{31}\omega_a^2 + C_{31}L_{31}\omega_r^2 + \sqrt{(1 + C_0 L_{31}\omega_a^2 + C_{31}L_{31}\omega_r^2)^2 - 4(C_0 L_{31} + C_{31}L_{31})\omega_r^2}}{2(C_0 L_{31} + C_{31}L_{31})}}$$

Figure 9C:
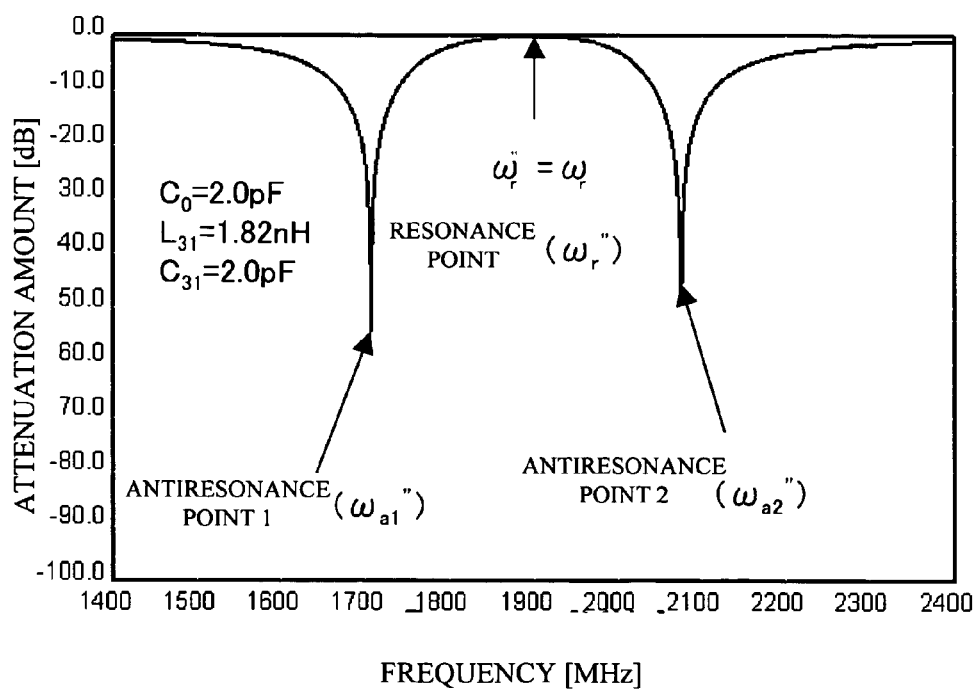
FIG. 9C shows passband characteristic of the resonant circuit in accordance with the first embodiment of the present invention.

FIG. 9C is a view showing the attenuation amount calculated with the use of the equivalent circuit of FIG. 9B with respect to the frequency of the resonant circuit employed in the first embodiment. Here, the resonance frequency $f_r$ is set to 1900 MHz, the antiresonance frequency $f_a$ is set to 1970 MHz, C0 is set to 2.0 pF, L31 is set to 1.82 nH, and C31 is set to 2.0 pF. Referring to FIG. 9C, the attenuation amount is the lowest at the resonance point $f''_r$ ($\omega''_r$) and is the highest at the antiresonance point $1f''_{a1}$ ($\omega''_{a1}$) and the antiresonance point $2f''_{a2}$ ($\omega''_{a2}$). That is to say, attenuation poles are the antiresonance point $1f''_{a1}$ ($\omega''_{a1}$) and the antiresonance point $2f''_{a2}$ ($\omega''_{a2}$). The resonant circuit employed in the first embodiment is capable of improving the attenuation characteristic of the ladder type filter with the use of the antiresonance point 1 or the antiresonance point 2, same as conventional resonant circuit.

Figure 10:
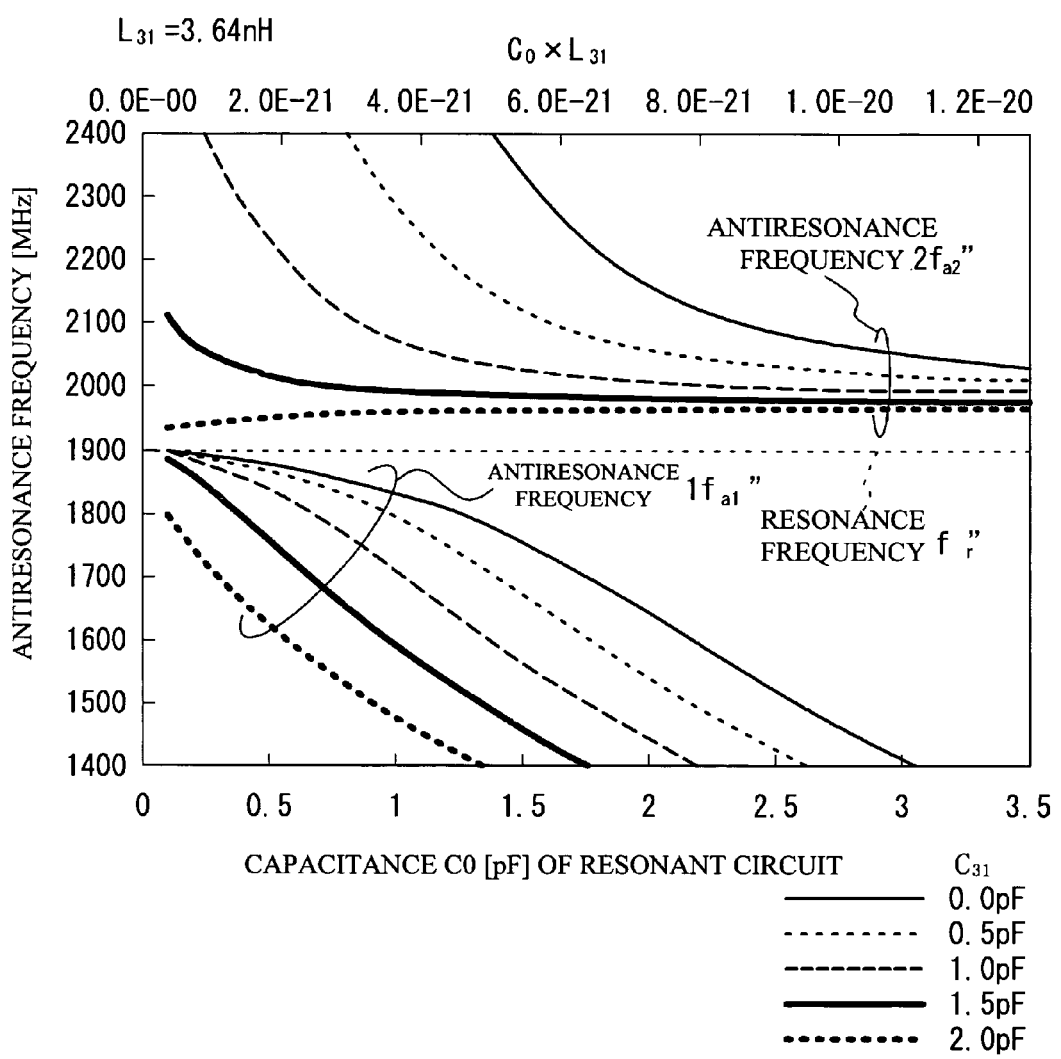
FIG. 10 is a view showing an antiresonance point and a resonance point of the resonant circuit with respect to $C0$ and $C0 \times L21$ in accordance with the first embodiment of the present invention.

FIG. 10 is a view showing the antiresonance frequency $f''_{a1}$ and $f''_{a2}$ with respect to C0, while C31 is changed from 0 pF to 2.0 pF. The horizontal axis represents C0 and C0×L21, and the vertical axis represents the antiresonance frequency and the resonance frequency. Referring to FIG. 10, the antiresonance frequencies $f''_{a1}$ and $f''_{a2}$ can be determined by parameters (C0×L31) and C31. Therefore, the two antiresonance points can be arbitrarily set. Accordingly, in the filter to be designed with the use of two antiresonance points (attenuation poles), for example, it is possible to design that the two antiresonance points at desired frequencies, thereby improving the design flexibility.

Figure 11A:
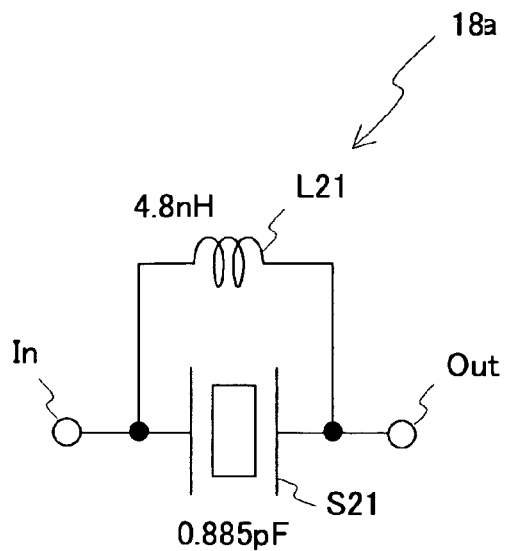
FIG. 11A shows a resonant circuit of the conventional example 1.
Figure 11B:
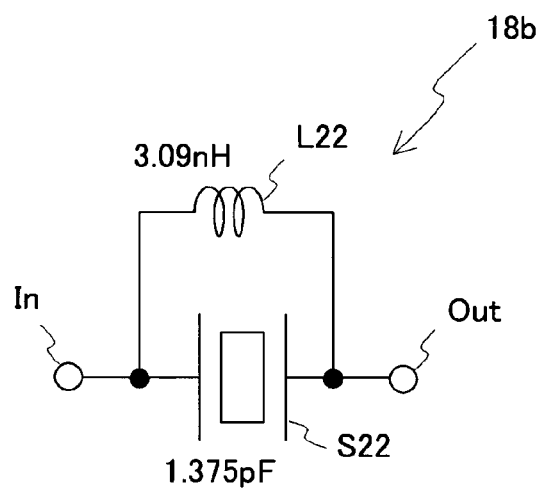
FIG. 11B shows a resonant circuit of the comparative example 1.
Figure 11C:
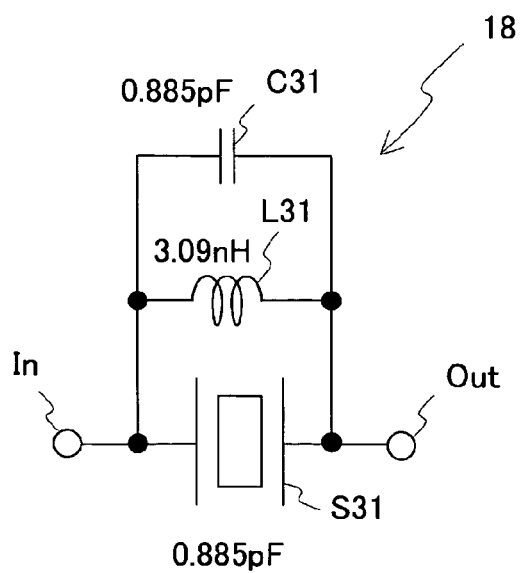
FIG. 11C shows a resonant circuit used in the first embodiment.

Next, a description is given of effects of the resonant circuit employed in the first embodiment, in a case where one of the antiresonance points (antiresonance point 1) is used as an attenuation pole. FIG. 11A shows a resonant circuit 18a of conventional example 1. FIG. 11B shows a resonant circuit 18b of comparative example 1. FIG. 11C shows a resonant circuit 18 used in the first embodiment. Referring to FIG. 11A, the resonant circuit 18a of the conventional example 1 includes the inductor L21 of 4.8 nH connected in parallel with the resonator S21 having the capacitance of 0.885 pF. Referring to FIG. 11B, the comparative example 1 is an example where the capacitance of the resonator S22 is set to 1.375 pF, and the inductance of the inductor L22 connected in parallel is set to 3.09 nH so as to reduce the size of the inductor of the resonant circuit 18a. (C0×L21) of the conventional example 1 is almost equal in value to the comparative example 1 (C0×L22). Therefore, the conventional example 1 and the comparative example 1 have almost the same antiresonance point 1.

Figure 1C:
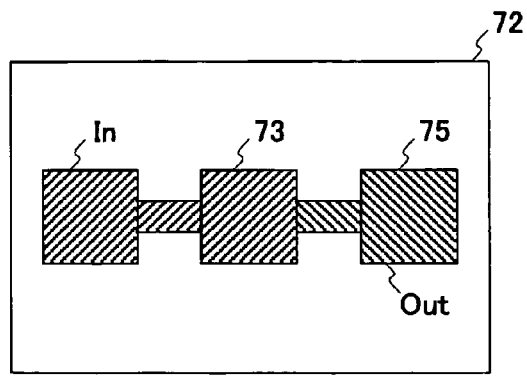
FIG. 1C is a top view of FBAR.
Figure 1D:
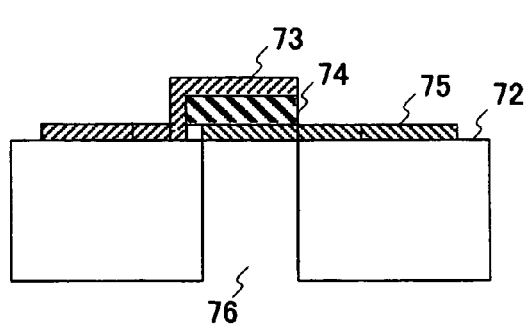
FIG. 1D is a cross-sectional view of FBAR.
Figure 2:
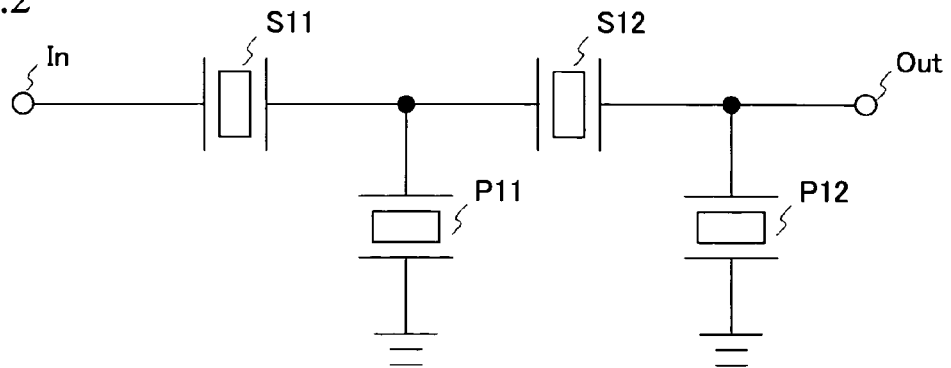
FIG. 2 shows a configuration of a ladder type filter.
Figure 3A:
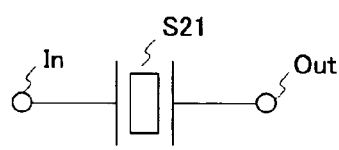
FIG. 3A shows a structure of a series resonant circuit.
Figure 3B:
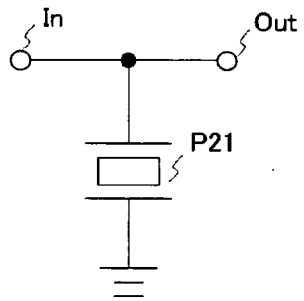
FIG. 3B shows a structure of a parallel resonant circuit.
Figure 3C:
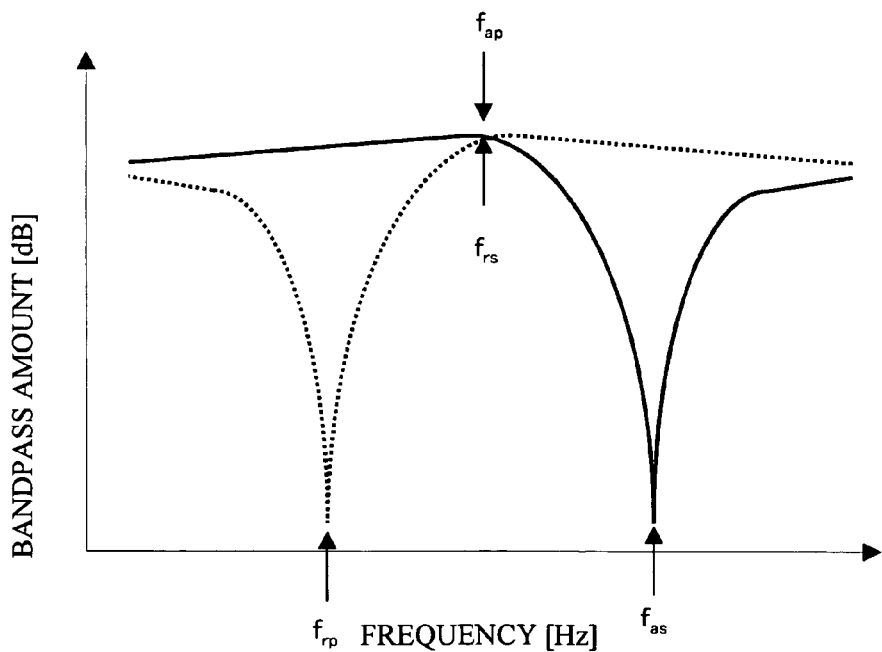
FIG. 3C shows passband characteristics of the series resonant circuit and parallel resonant circuit.
Figure 4A:
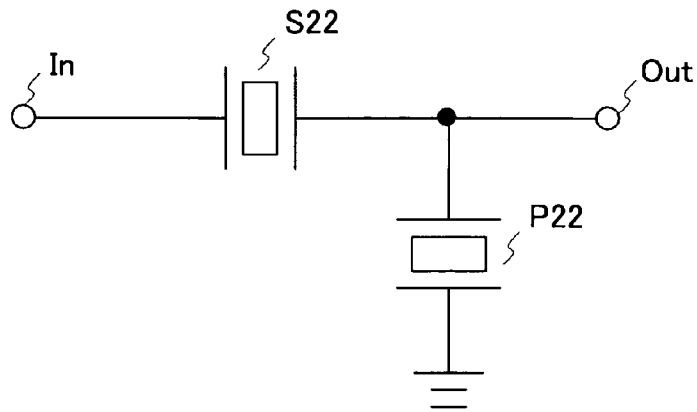
FIG. 4A shows a structure of a one-stage ladder type filter.
Figure 4B:
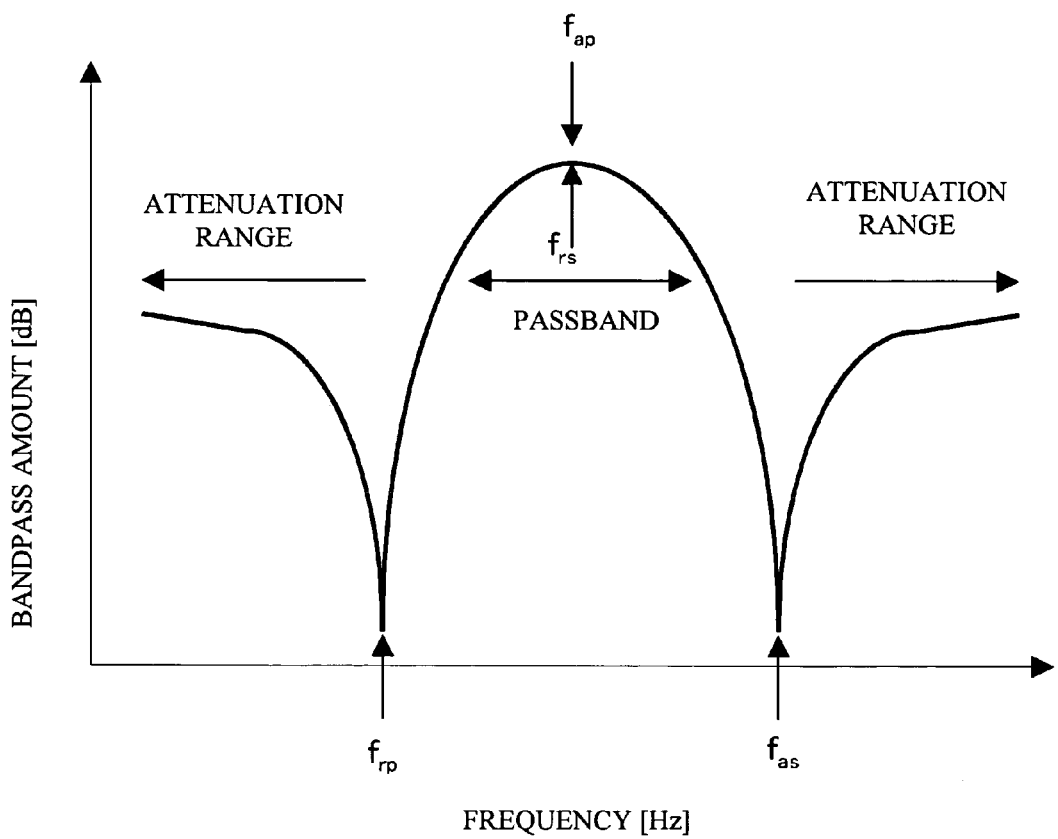
FIG. 4B shows passband characteristic of the one-stage ladder type filter.
Figure 5:
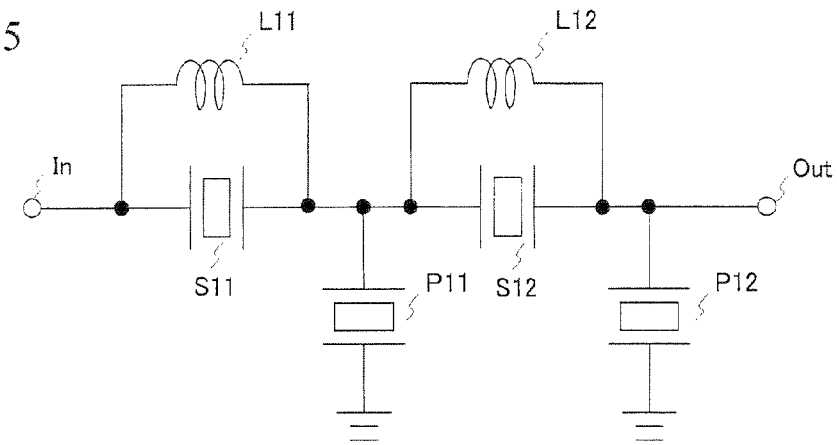
FIG. 5 shows a conventional filter.

Referring to FIG. 1C, in the resonant circuit 18 employed in the first embodiment, the capacitance of the resonator S31 is set to 0.885 pF, same as that of the conventional example 1, and the inductance of the inductor L31 connected in parallel is set to 3.09 nH, same as that of the comparative example 1. A capacitor C31 of 0.885 pF is further connected in parallel so that the antiresonance point 1 becomes equal to that of the conventional example 1.

Figure 12A:
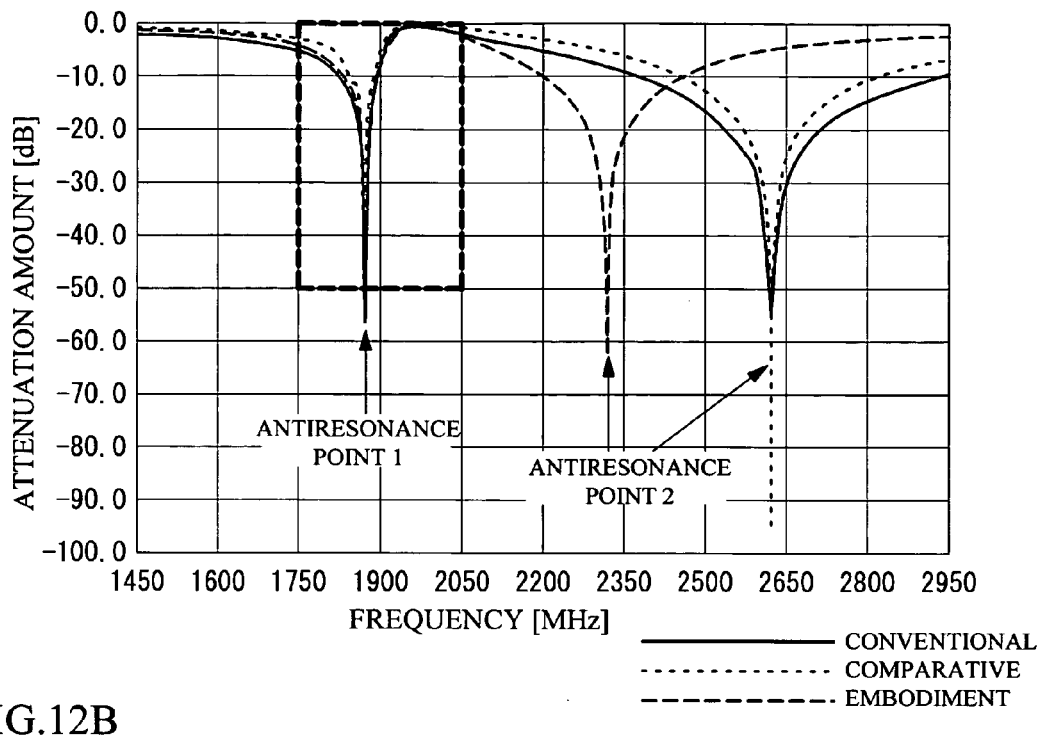
FIG. 12A shows passband characteristics of the resonators of the conventional example 1, the comparative example 1, and employed in the first embodiment of the present invention.
Figure 12B:
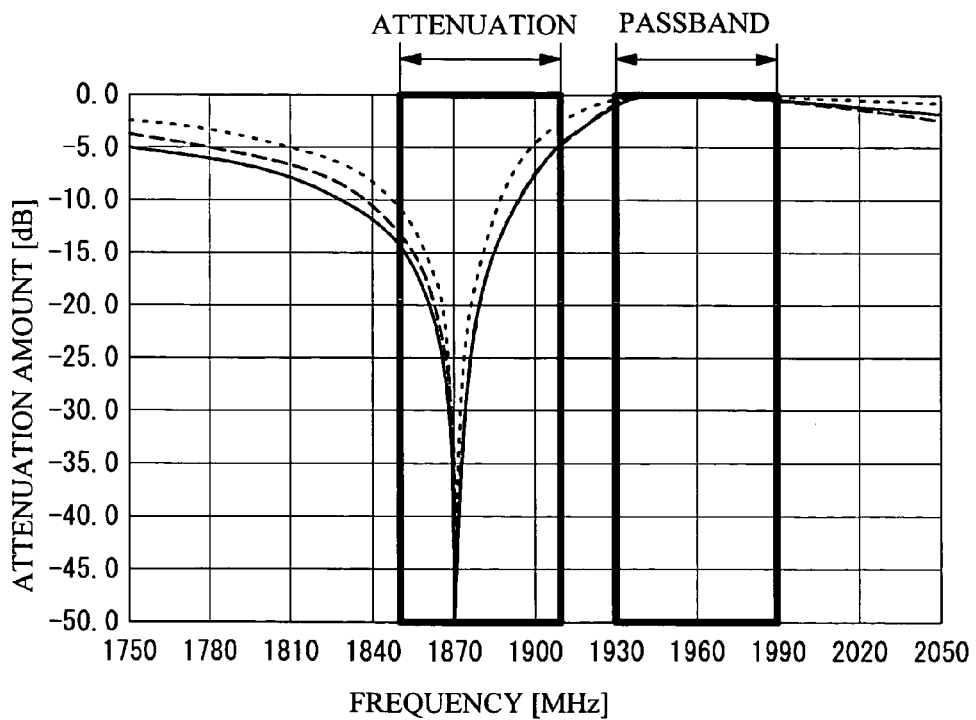
FIG. 12B is an enlarged view around an antiresonance point 1.

FIG. 12A is a view showing calculation results of the passband characteristic of the resonant circuit used in the above-described conventional example 1, in the comparative example 1, and in the first embodiment. The horizontal line represents the frequency, and the vertical line represents the attenuation amount. FIG. 12B is an enlarged view around the antiresonance point 1 shown in FIG. 12A, and also shows an attenuation range and passband range that are demanded for the filter that includes the resonant circuit. Referring to FIG. 12A, the frequencies of the antiresonance points 1 in the three resonant circuits are almost the same. Referring to FIG. 12B, in such demanded attenuation range, the comparative example 1 is smaller in the attenuation amount than the conventional example 1, and is poor in the attenuation characteristic. Meanwhile, the curve of the first embodiment and that of the conventional example 1 roughly overlap, and have similar attenuation characteristics.

An inductor demands a large area, making the mounting area therefor becomes larger. For this reason, the mounting area can be decreased by replacing the resonant circuit 18a of the conventional example 1 with the resonant circuit 18b of the comparative example 1 or the resonant circuit 18 employed in the first embodiment. The capacitance of the resonator S22 is made greater than that of the conventional example 1, so that the antiresonance point of the comparative example 1 is set equal to that of the conventional example 1. Accordingly, as shown in FIG. 12B, the attenuation characteristic is degraded. However, the resonant circuit 18 employed in the first embodiment has the resonator S31 whose capacitance is same as that of the resonator S21 in the resonant circuit 18a of the conventional example 1. It is possible to make the attenuation characteristic of the first embodiment almost equal to that of the conventional example 1.

Next, the calculation is conducted to learn how much the inductance L31 can be reduced by the capacitor C31 connected. L31 is described in Expression 9 and Expression 10, which are respectively modifications of Expression 7 and Expression 8.

(Expression 9)

$$L_{31} = \frac{\omega''^2_{a1} - \omega_r^2}{\omega''^2_{a1}\{C_0(\omega''^2_{a1} - \omega_a^2) + C_{31}(\omega''^2_{a1} - \omega_r^2)\}}$$

(Expression 10)

$$L_{31} = \frac{\omega''^2_{a2} - \omega_r^2}{\omega''^2_{a2}\{C_0(\omega''^2_{a2} - \omega_a^2) + C_{31}(\omega''^2_{a2} - \omega_r^2)\}}$$

Figure 13:
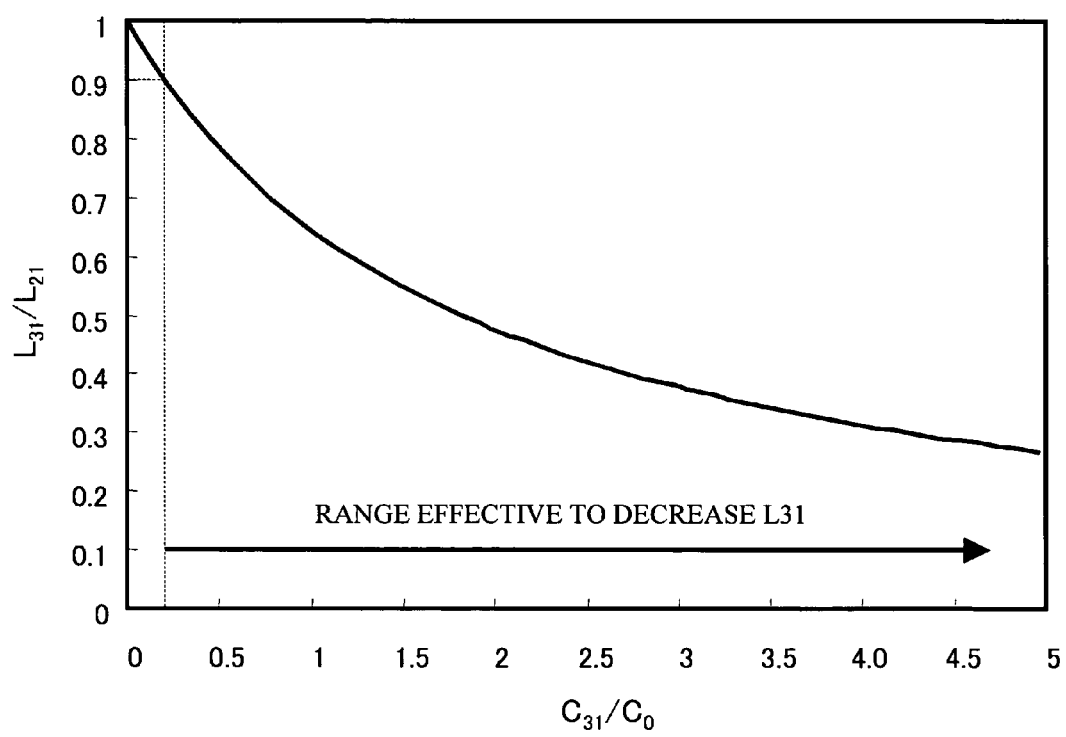
FIG. 13 is a view showing a standardized inductance value $L31/L21$ with respect to a standardized capacitance value $C31/C0$.

FIG. 13 is a view showing a standardized inductance value L31/L21 with respect to a standardized capacitance value C31/C0 with the use of Expression 9 so that the resonant circuit has the same antiresonance point 1. Here, the antiresonance point 1 is set to that shown in FIG. 12A and FIG. 12B. When C31/C0 equals zero, the resonant circuit is of the conventional example in which the inductor is connected in parallel with the resonator. If C31/C0 is made greater, L31/L21 becomes smaller. In other words, it is only necessary to increase the capacitance C31 connected in parallel with the resonator S31 in order to obtain the resonant circuit having the same antiresonance point 1, even if the inductance L31 connected in parallel is made smaller. In this manner, the inductor L31 can be decreased in size, by increasing the capacitance C31. Generally, when the inductor is fabricated on a multilayer substrate, the error of inductance is 10% at maximum. Therefore, the effect of reduced mounting area can be exhibited, from a practical viewpoint, when L31 equals to or less than 90% of L21. From FIG. 13, it is possible to make L31 equal to or less than 90% of L21, by setting C31/C0 to 0.2 or more. As described, the capacitance value of the capacitor C31 is preferably equal to or more than 0.2 times of the capacitance value C0 of the resonator. Therefore, it is possible to obtain the effect of reducing the practical mounting area.

Second Embodiment

Figure 14A:
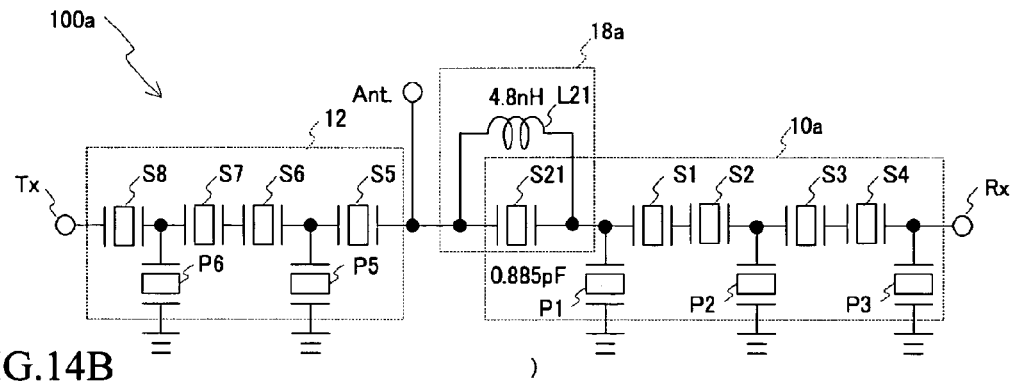
FIG. 14A is a block diagram of a duplexer of the conventional example 2.
Figure 14B:
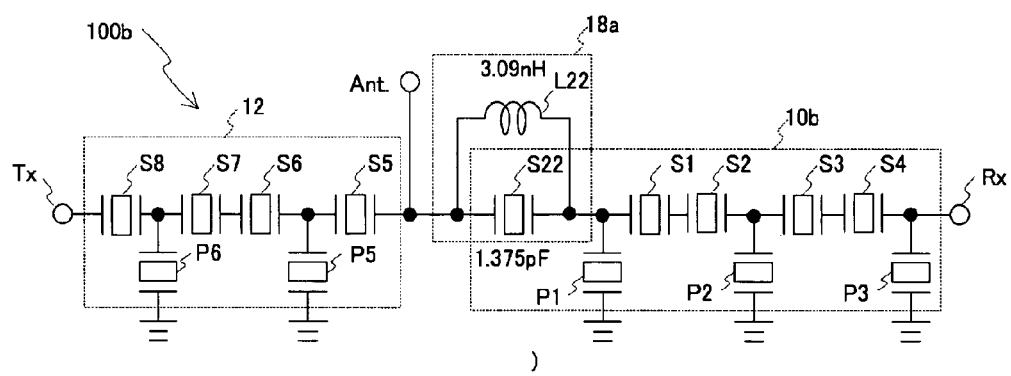
FIG. 14B is a block diagram of a duplexer of the comparative example 2.
Figure 14C:
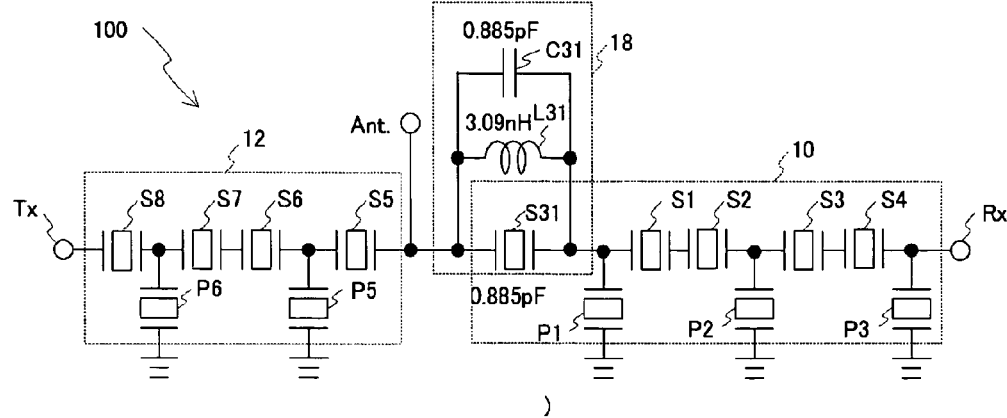
FIG. 14C is a block diagram of a duplexer in accordance with a second embodiment of the present invention.

In a second embodiment of the present invention, the resonant circuit employed in the first embodiment is applied to an antenna duplexer. FIG. 14A through FIG. 14C are block diagrams of the duplexer. FIG. 14A is a block diagram of a duplexer 100a of the conventional example 2 having the resonant circuit 18a of the conventional example 1. FIG. 14B is a block diagram of a duplexer 100b of the comparative example 2 having the resonant circuit 18b of the comparative example 1. FIG. 14C is a block diagram of a duplexer 100 having the resonant circuit 18 employed in the first embodiment in accordance with the second embodiment of the present invention.

Referring to FIG. 14C, the duplexer 100 employed in the second embodiment includes a receive filter 10 (first filter) connected between an antenna terminal Ant and the receiving terminal Rx. The duplexer 100 also includes a matching circuit composed of the resonant circuit 18 connected between the receive filter 10 and the antenna terminal Ant. The duplexer 100 further includes a transmit filter 12 (second filter) connected between the antenna terminal Ant and the transmitting terminal Tx. The receive filter 10 is a ladder type filter that includes parallel resonators P1 through P3, series resonators S1 through S4, and the series resonator S31. The transmit filter 12 is a ladder type filter that includes parallel resonators P5 and P6 and the series resonators S5 through S8.

Here, the resonator S31 functions as a resonator of the matching circuit as well as a resonator of the receive filter 10.

Referring now to FIG. 14A, in the duplexer 100a of the conventional example 2, except that the resonant circuit 18a of the conventional example 1 is used for the matching circuit and for the receive filter 10a, the same components and configurations as those of the second embodiment have the same reference numerals and a detailed explanation will be omitted.

Figure 15A:
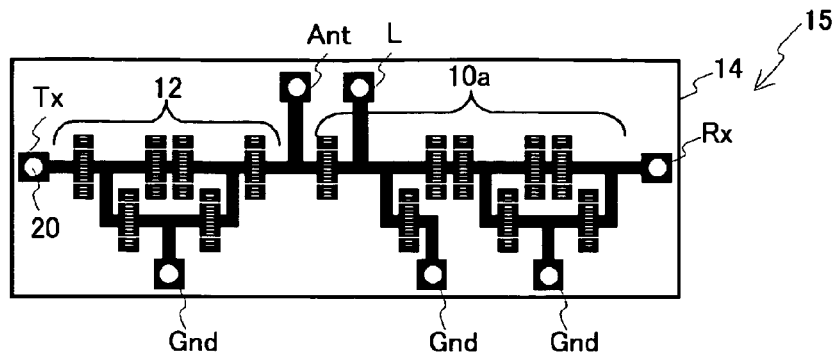
FIG. 15A through FIG. 15C show the duplexer of the conventional example 2.
Figure 15B:
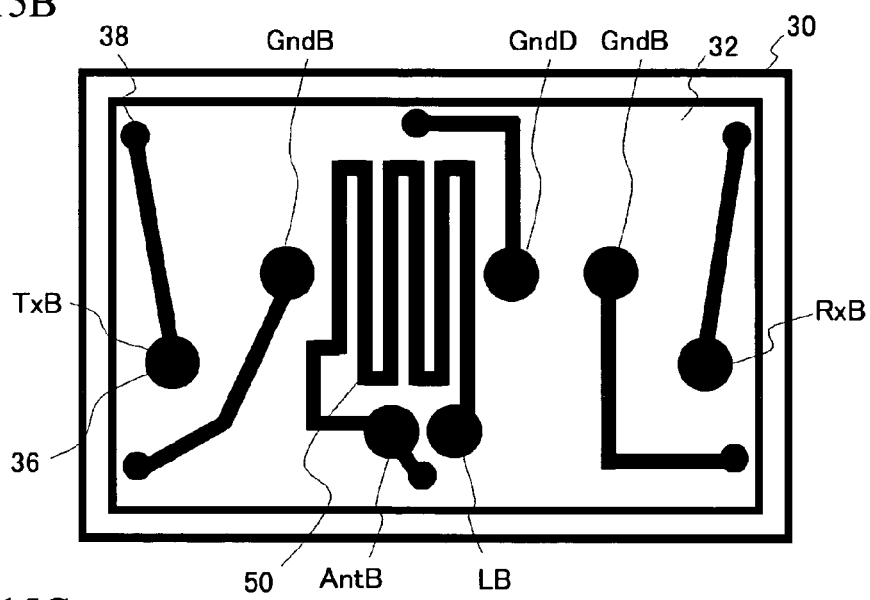
Figure 15C:
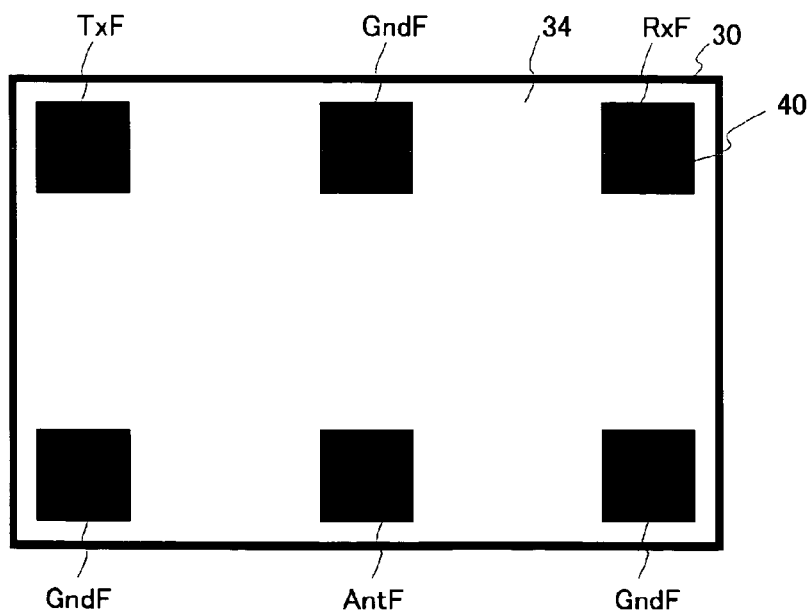
Figure 16A:
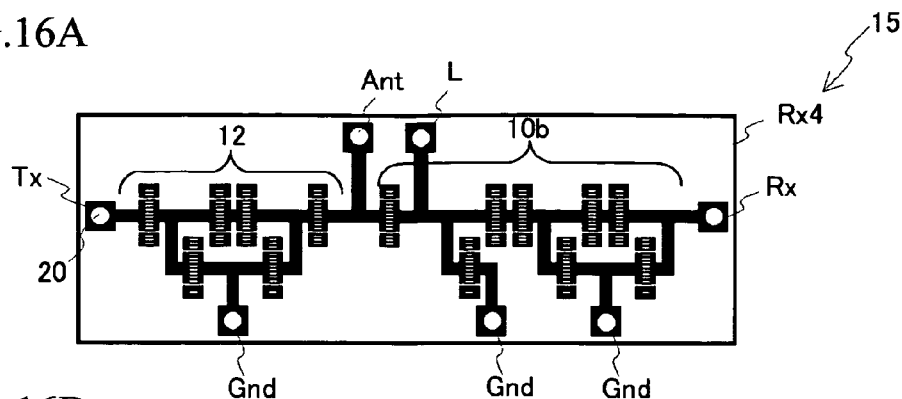
FIG. 16A through FIG. 16C show the duplexer of the comparative example 2.
Figure 16B:
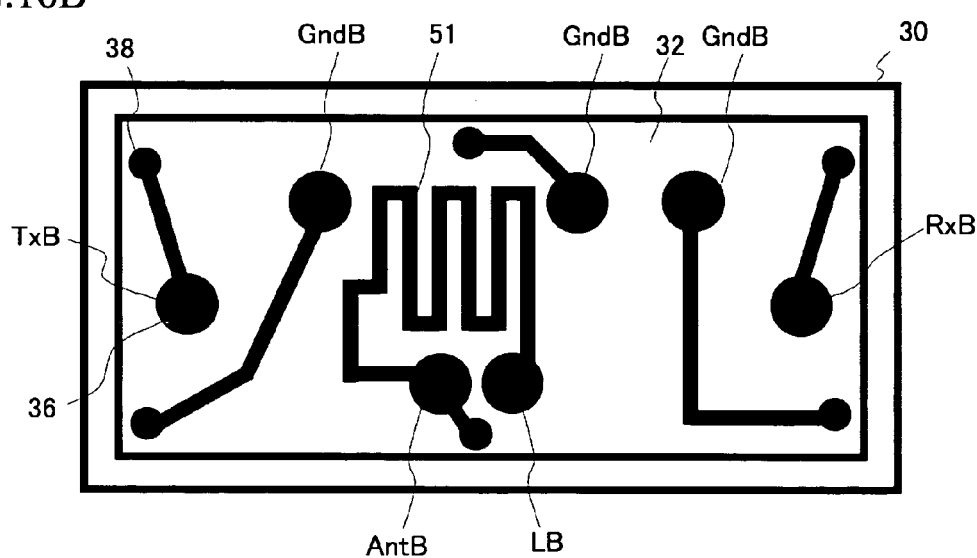
Figure 16C:
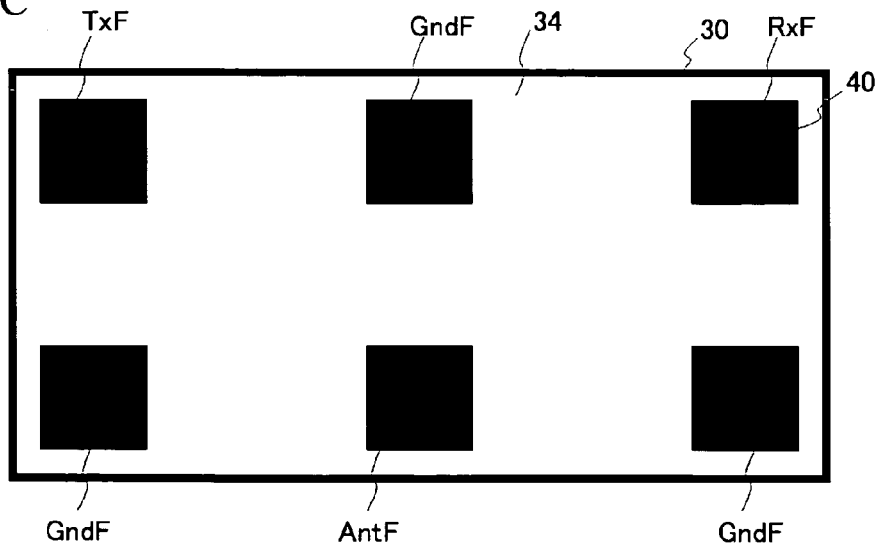

FIG. 15A through FIG. 15C are mounting drawings of the duplexer of the conventional example 2. FIG. 16A through FIG. 16C are mounting drawings of the duplexer of the comparative example 2. FIG. 17 and FIG. 18A through FIG. 18C are mounting drawings of the duplexer employed in the second embodiment.

Figure 17:
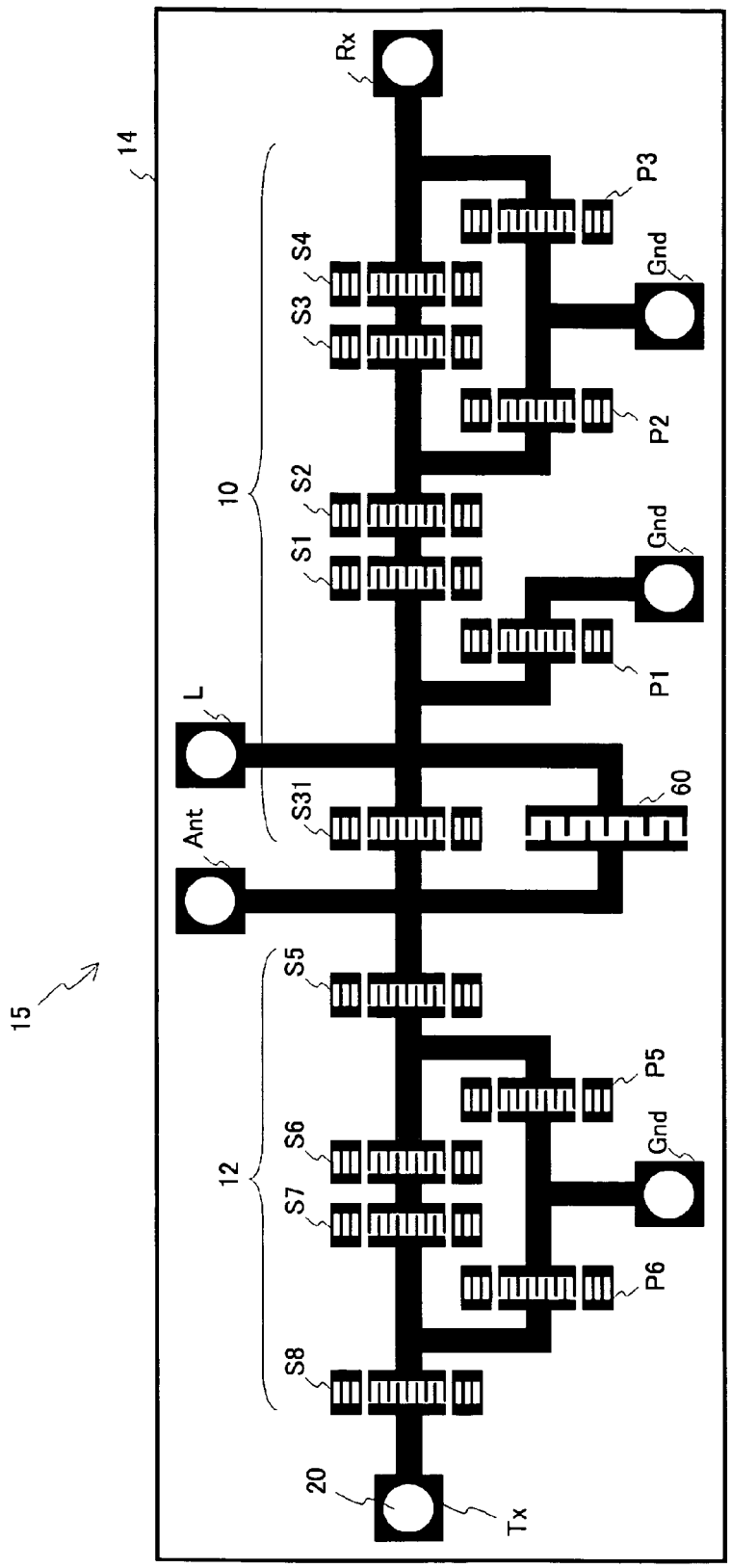
FIG. 17 is a top view of a chip of the duplexer in accordance with the second embodiment of the present invention.

FIG. 17 is a top view of a chip 15 in which the filter employed in the second embodiment is fabricated. In FIG. 17, lines in black are regions where the metal (aluminum, for example) is formed. The receive filter 10 and the transmit filter 12 are formed on a piezoelectric substrate 14, with the use of the ladder type filter composed of the SAW filters of the resonant circuits. In the receive filter 10, the series resonators S31 and the series resonators S1 through S4 are connected in series. The series resonator S4 is connected to the receiving terminal Rx, and the receiving terminal Rx is connected by the parallel resonator P3. The parallel resonator P2 is connected between the series resonators S2 and S3, and the other end of the parallel resonator P3 and that of the parallel resonator P2 are connected to the ground terminal Gnd. The parallel resonator P1 is connected between the series resonators S31 and S1, and the other end of the parallel resonator P1 is connected to the ground terminal Gnd. A terminal L is also connected between the series resonators S31 and S1. The other end of the series resonator S31 is connected to the antenna terminal Ant.

A capacitor 60 composed of an IDT is connected in parallel with the series resonator S31. The capacitor 60 has electrode fingers having gaps therebetween approximately 1.5 times as wide as those in the IDTs respectively included in the resonators S1 through S8 and P1 through P6. This difference is provided for differentiating the resonance frequency of the IDT in the capacitor 60 and those of the resonant circuits used in the filters 10 and 12. The capacitance of the capacitor 60 is 0.885 pF.

In the transmit filter 12, the series resonators S5 through S7 are connected in series. The series resonators S5 through S8 are respectively connected to the antenna terminal Ant and the Tx terminal. The parallel resonator P5 is connected between the series resonators S5 and S6, and the parallel resonator P6 is connected between the series resonators S7 and S8. The other end of the parallel resonator S7 and that of the parallel resonator S8 are connected to the ground terminal Gnd. The parallel resonator P1 is connected between the series resonators S31 and S1, and the other end of the parallel resonator P1 is connected to the ground terminal Gnd. Au bumps are respectively formed for the terminals Ant, L, Tx, Rx, and Gnd.

Figure 18A:
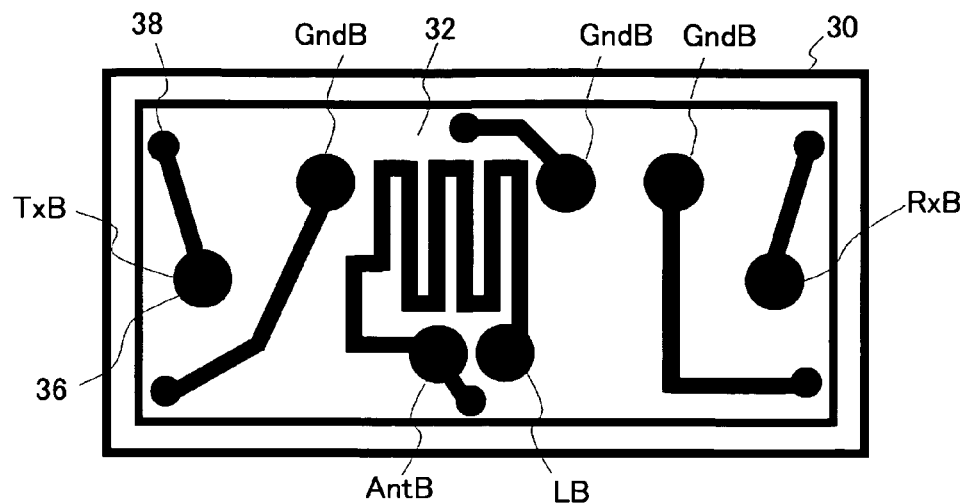
FIG. 18A through FIG. 18C show duplexer in accordance with the second embodiment of the present invention.
Figure 18B:
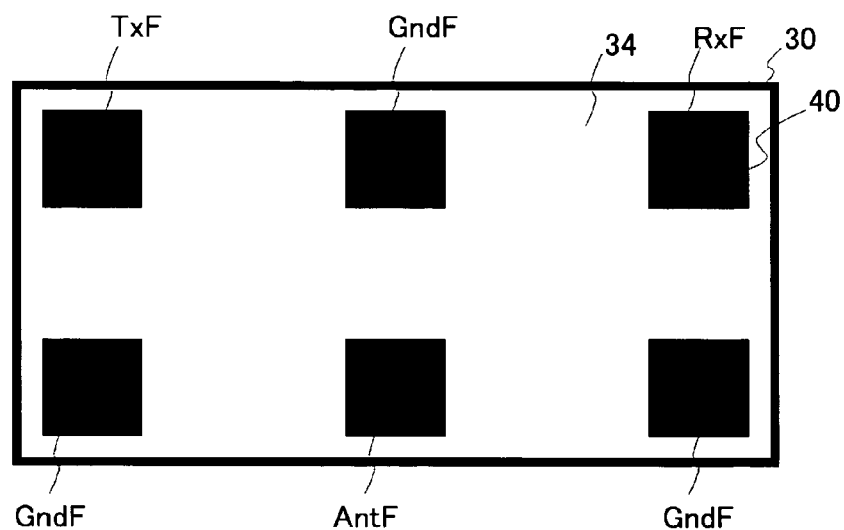
Figure 18C:
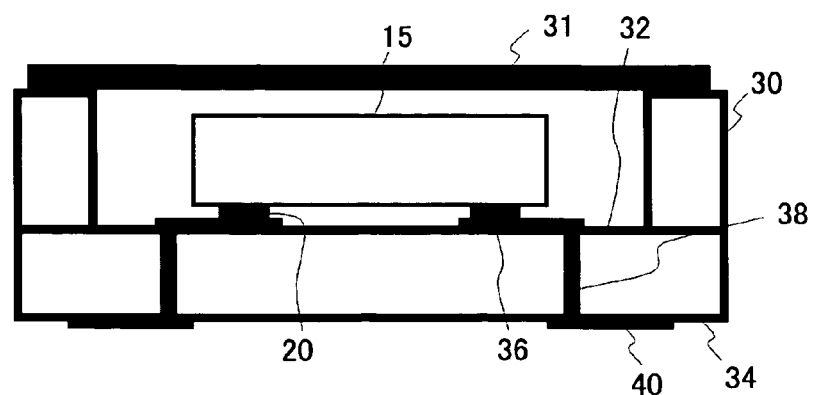

FIG. 18C is a cross-sectional view of a package in which the chip used in the second embodiment is mounted. The chip 15 is flip-chip mounted (in a face-down manner) on a die attach surface 32 of a stacked package 30 with the use of bumps 20. Conductive bump pads 36 that press and bond the bumps are formed on the die attach surface 32. The bump pads 36 are connected to conductive vias 38 embedded. The vias 38 penetrate through the stacked package 30 to a backside thereof, and are coupled to conductive footpads 40 formed on the backside 34. The cavity portion of the stacked package 30 is hermetically sealed by a lid (cap) 31. In this manner, the duplexer 100 is completed.

FIG. 18A is a top view of the stacked package 30 before the chip 15 is mounted thereon. In FIG. 18A, the regions in black are those where the metal (gold, for example) is provided. One or more bumps 20 formed for the chip 15 are respectively pressed and bonded to one or more bump pads 36, and the chip 15 and the bump pads 36 are electrically coupled. The terminals Ant, L, Tx, Rx, and Gnd are respectively pressed and bonded to bump pads AntB, LB, TxB, RxB, and GndB. An inductor 52 of a line pattern is provided between the bump pads AntB and LB. The inductance of the inductor 52 is 3.09 nH. Accordingly, the inductor 52 is connected in parallel with the resonator S31 formed in the chip. The bump pads AntB, TxB, RxB, and GndB are coupled to the vias 38.

FIG. 18B is a top perspective view of the backside 34 of the stacked package 30. A footpad 40 is provided on the backside 34. The vias 38 connected to the bump pads AntB, TxB, RxB, and GndB are respectively coupled to the footpads AntF, TxF, RxF, and GndF, and are also coupled to the outside of the stacked package 30.

As described heretofore, the inductor 52 and the capacitor 60 are connected in parallel with the resonator S31.

FIG. 15A is a top view of the chip of the duplexer of the conventional example 2. FIG. 15B is a top view before the chip of the stacked package 30 is mounted. FIG. 15C is a perspective view of the backside 34 of the stacked package 30. In the conventional example 2, except that the capacitor 60 is not provided on the chip surface, the inductance of the inductor 50 is 4.8 nH, and the inductor area is great, the same components and configurations as those of the second embodiment shown in FIG. 17, FIG. 18A, and FIG. 18B have the same reference numerals and a detailed explanation will be omitted.

FIG. 16A is a top view of the chip of the duplexer of the comparative example 2. FIG. 16B is a top view before the chip of the stacked package 30 is mounted. FIG. 16C is a perspective view of the backside 34 of the stacked package 30. In the comparative example 2, except that the capacitor 60 is not provided on the chip surface, the same components and configurations as those of the second embodiment shown in FIG. 17, FIG. 18A, and FIG. 18B have the same reference numerals.

In the duplexer employed in the second embodiment and that of the comparative example 2, the package sizes (mounting area) are made smaller than that of the conventional example 2. This is because the inductor 51 in the comparative example 2 and that used in the second embodiment respectively have the inductance of 3.05 nH, which is reduced by approximately 64 percent from 4.8 nH of the inductance of the inductor 50 of the conventional example 2.

Figure 19A:
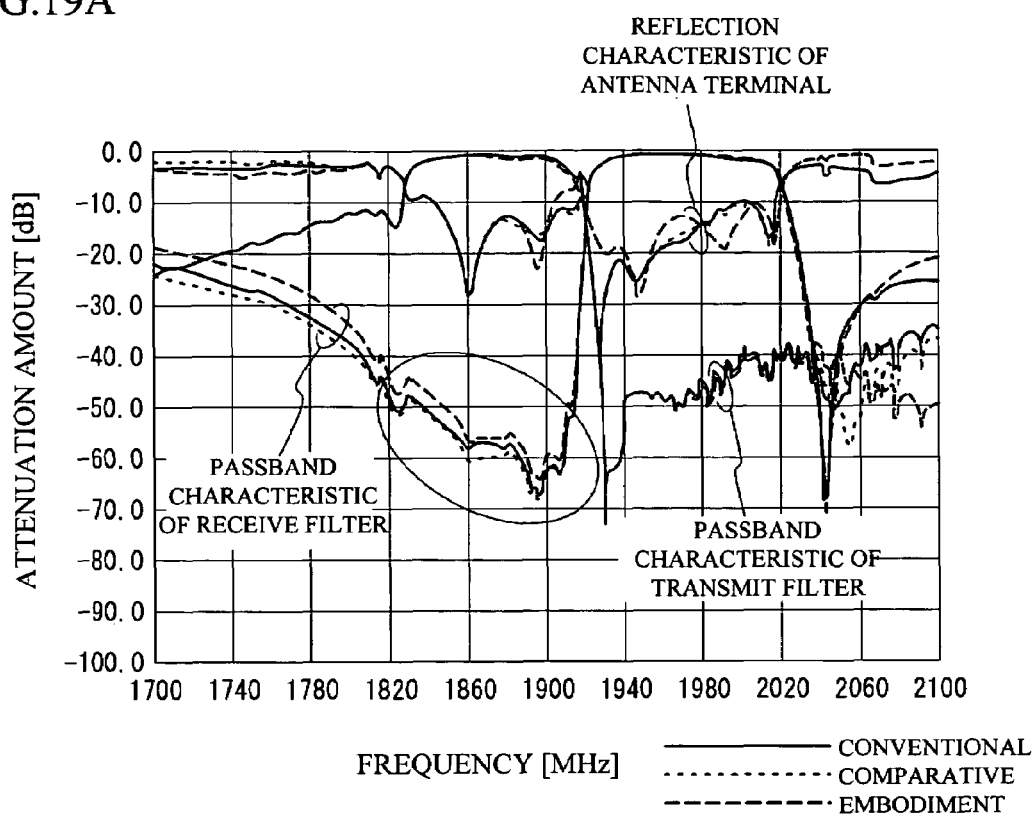
FIG. 19A shows measurement results of the passband characteristics of the receive filter and the transmit filter and the reflection characteristic of the antenna terminal of the duplexer in accordance with the conventional example 2, the comparative example 2, and the second embodiment.
Figure 19B:
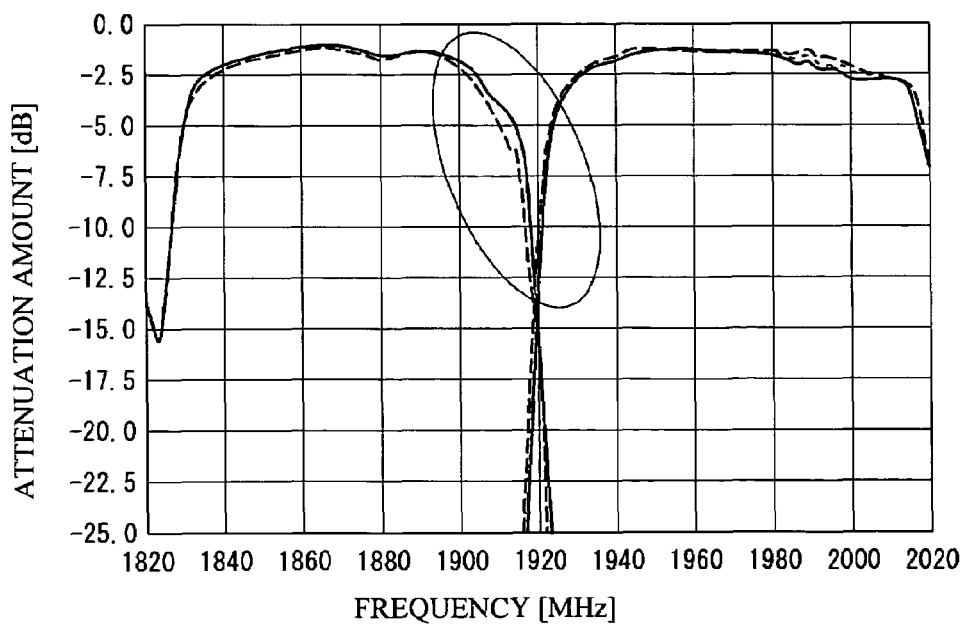
FIG. 19B is an enlarged view around the passband of the passband characteristics of the receive filter and the transmit filter.

FIG. 19A shows measurement results of the passband characteristics of the receive filter and the transmit filter and the reflection characteristic of the antenna terminal of the duplexer of the conventional example 2, of the comparative example 2, and used in the second embodiment. FIG. 19B is an enlarged view around the passband of the passband characteristics of the receive filter and the transmit filter. In the comparative example 2, the attenuation amount of the receive filter is degraded at 1850 MHz to 1910 MHz, which corresponds to the transmission passband (ellipse part in FIG. 19A). This represents that the attenuation amount of the resonant circuit 18b of the comparative example 1 is poorer than the resonant circuit 18a of the conventional example 1, as shown in FIG. 12B. In addition, loss of the transmit filter is increased around 1900 MHz to 1910 MHz near a high-frequency edge of the transmission passband (ellipse part in FIG. 19B). This results from the degraded reflection characteristic of the antenna terminal around the above-described passband.

Meanwhile, the passband characteristics of the receive filter and the transmit filter of the duplexer 100 employed in the second embodiment and the reflection characteristic of the antenna terminal are almost same as those of the duplexer 100a of the conventional example 2. In this manner, as to the duplexer 100 used in the second embodiment, it is possible to reduce the mounting area of the stacked package 30, while the passband characteristics of the filter are being kept almost the same as that of the conventional example 2. In addition, the resonant circuit 18 is located on the side of the antenna terminal Ant of the receive filter 10, and the antiresonance point (attenuation pole) is set to the side of the transmission frequency band. That is to say, the resonant circuit 18 is used as a series resonant circuit arranged closet to the antenna terminal Ant of the ladder type filter. This allows the resonant circuit 18 to function as the matching circuit of the duplexer and to improve the attenuation characteristic in the transmission passband of the receive filter 10.

Also, as descried in the second embodiment, the capacitor C31 of the resonant circuit 18 can be composed of a SAW resonator provided on an identical substrate on which the resonator S31 is provided. This enables the capacitor C31 to be small-sized. In addition, the inductor L31 of the resonant circuit 18 can be composed of a line pattern formed on the stacked package 30 on which the resonator S31 is mounted. Furthermore, the mounting area can be reduced in size by mounting in a face-down manner.

Third Embodiment

Figure 20A:
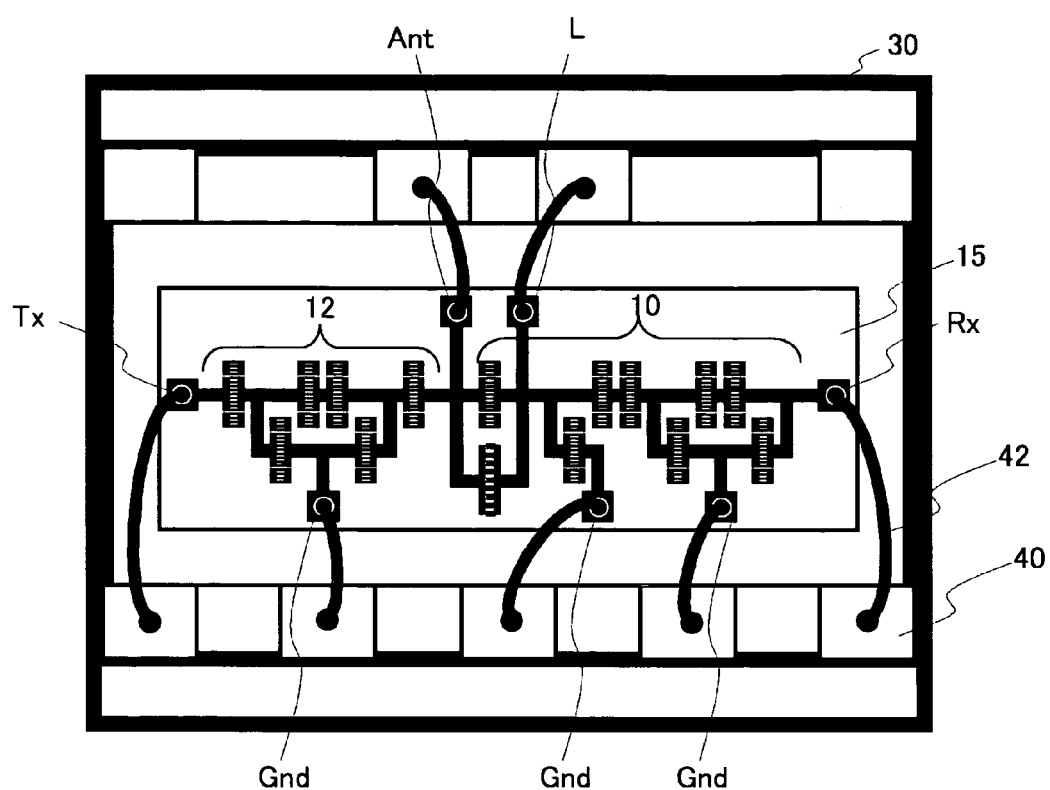
FIG. 20A is a top view of a stacked package on which the chip is mounted in accordance with a third embodiment of the present invention.
Figure 20B:
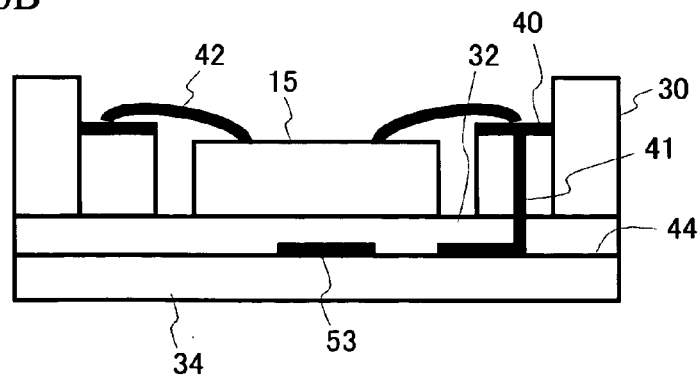
FIG. 20B is a cross-sectional view of the stacked package in accordance with the third embodiment of the present invention.
Figure 21:
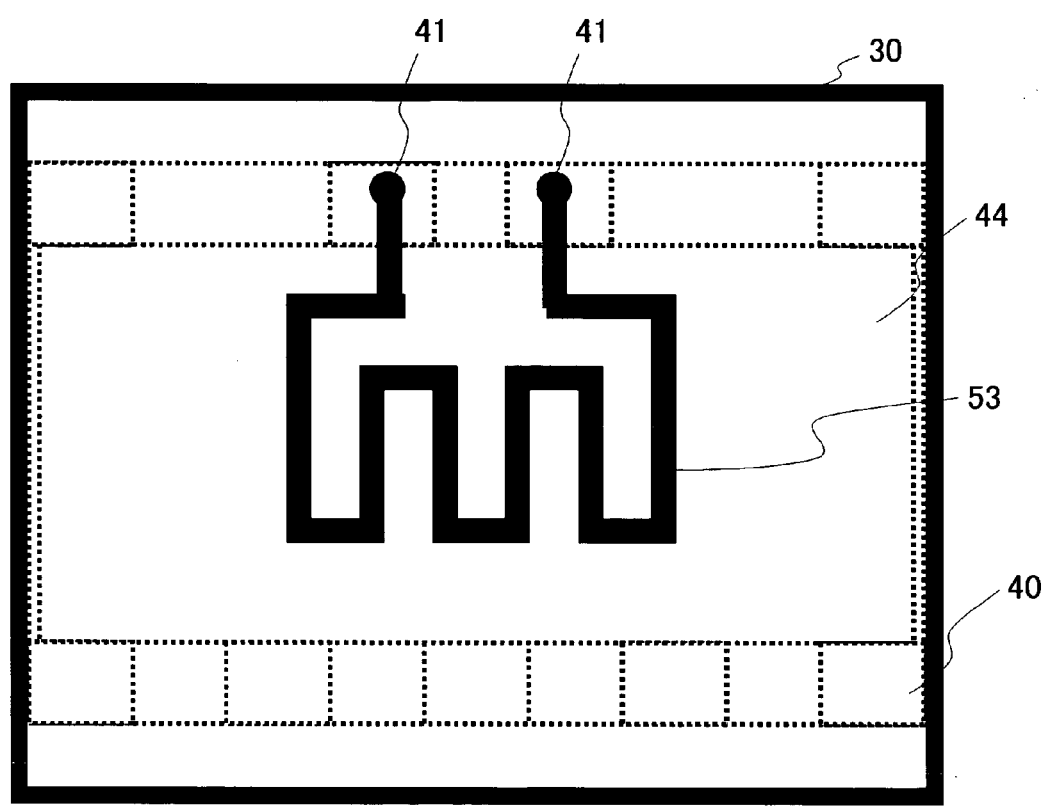
FIG. 21 is a top view of a lamination layer of the stacked package in accordance with the third embodiment of the present invention.

A third embodiment of the present invention is an example in which the capacitor 60 is formed on the chip 15, an inductor 53 is formed in the stacked package 30, and the chip 15 is mounted in a face-up manner. FIG. 20A is a top view of the stacked package 30 on which the chip 15 is mounted. FIG. 20B is a cross-sectional view of the stacked package 30. FIG. 21 is a top view of a lamination layer 44 of the stacked package 30. In the third embodiment, the same components and configurations as those of the second embodiment have the same reference numerals and a detailed explanation will be omitted. Referring to FIG. 20A and FIG. 20B, the chip 15 is mounted on the die attach surface 32. In the chip 15, except that no bumps are formed in the terminals Ant, L, Tx, Rx, or Gnd, the same components and configurations as those of the second embodiment have the same reference numerals. Each terminal is connected to the pads 40 of the stacked package by a wire 42. In the pads 40 connected by the antenna terminals Ant and L, vias 41 are formed in the stacked package 30, to be coupled to the inductor 53 formed in the lamination layer 44. Referring to FIG. 21, the inductor 53 made of a conductive line pattern is provided on the surface of the lamination layer 44.

In accordance with the third embodiment, the inductor 53 is connected in series with the resonator S31 through the via 41 and the wire 42. As stated, it is possible to mount the chip 15 in a face-up manner.

Fourth Embodiment

Figure 22A:
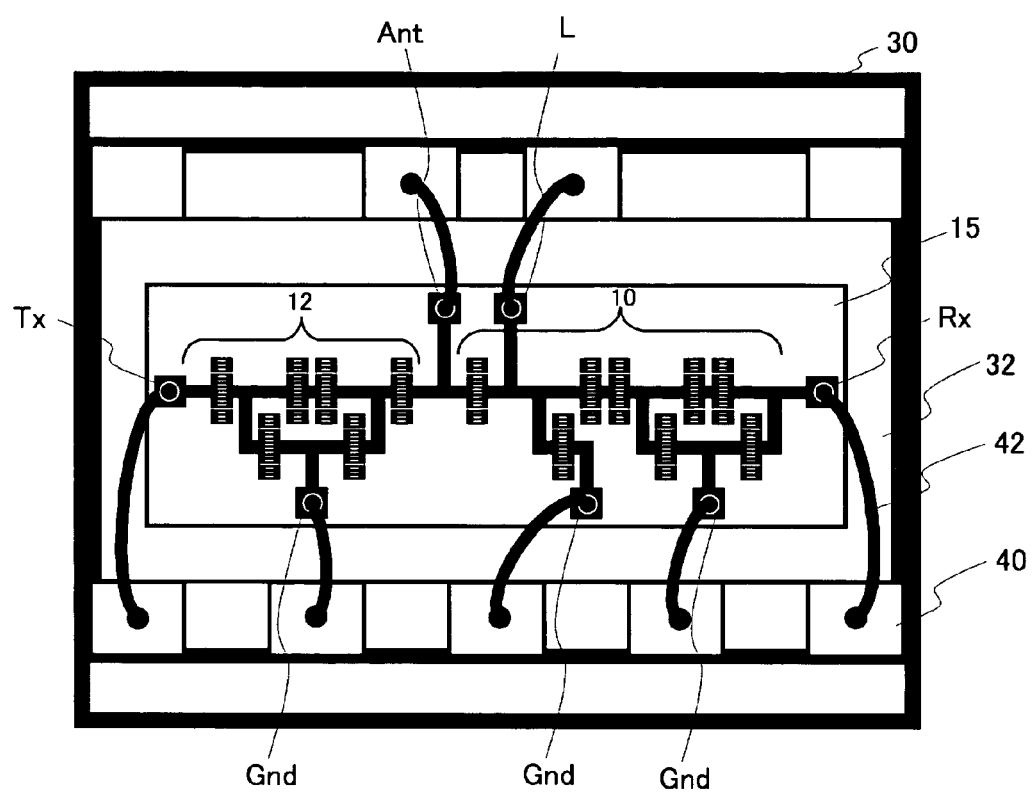
FIG. 22A is a top view of the stacked package on which the chip is mounted in accordance with a fourth embodiment of the present invention.
Figure 22B:
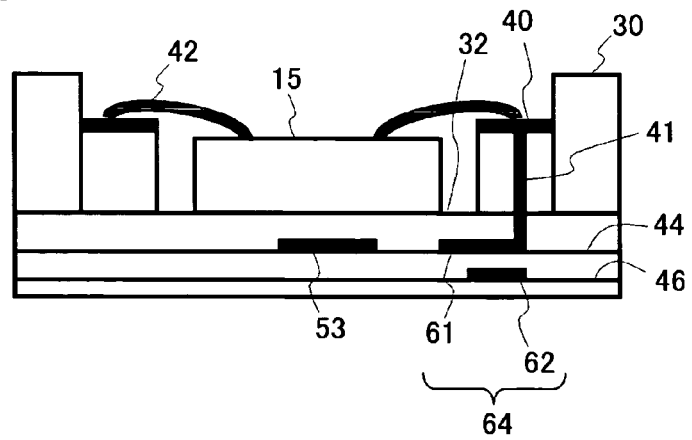
FIG. 22B is a cross-sectional view of the stacked package in accordance with the fourth embodiment of the present invention.
Figure 23A:
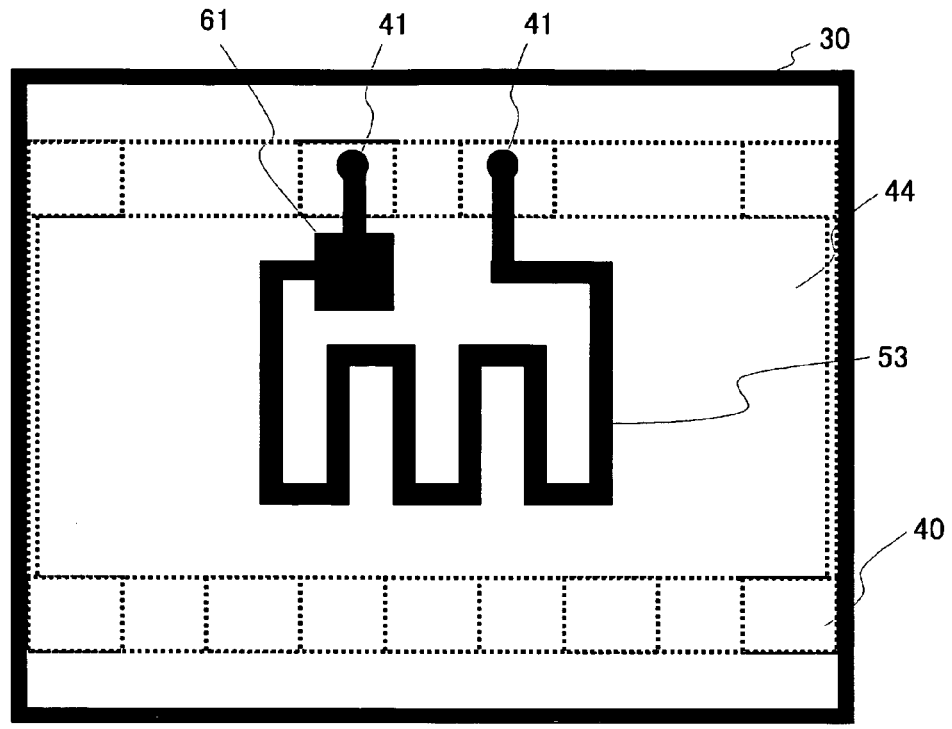
FIG. 23A and is a top view of the lamination layer in accordance with the fourth embodiment of the present invention.
Figure 23B:
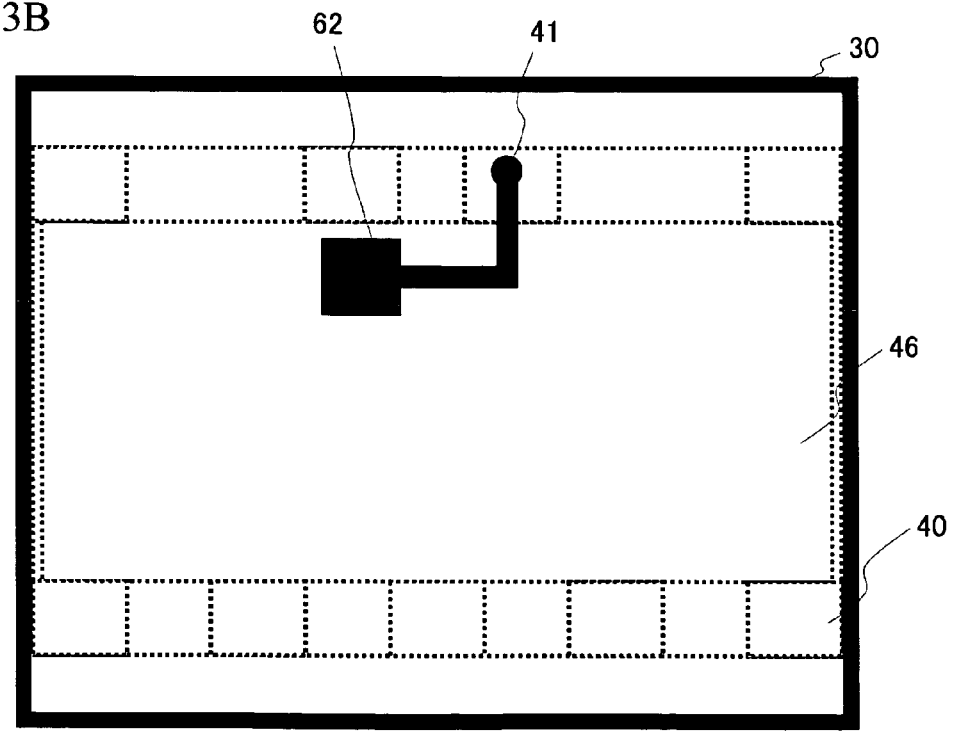
FIG. 23B is a top view of another lamination layer in accordance with the fourth embodiment of the present invention.

A fourth embodiment of the present invention is an example in which a capacitor 64 and the inductor 53 are formed in the stacked package 30, and the chip 15 is mounted in a face-up manner. FIG. 22A is a top view of the stacked package 30 on which the chip 15 is mounted. FIG. 22B is a cross-sectional view of the stacked package 30. FIG. 23A and is a top view of the lamination layer 44 of the stacked package 30. FIG. 23B is a top view of a lamination layer 46 of the stacked package 30. In the fourth embodiment, the same components and configurations as those of the third embodiment have the same reference numerals and a detailed explanation will be omitted. Referring to FIG. 22A and FIG. 22B, the capacitor 60 is not provided in the chip 15. However, an upper layer electrode 61 is provided on the lamination layer 44 and a lower layer electrode 62 is provided on the lamination layer 46. Accordingly, the capacitor 64 is formed. Referring now to FIG. 23A, the upper layer electrode 61 composed of a conductive pattern and the inductor 53 composed of a conductive line pattern are provided on the surface of the lamination layer 44. Referring now to FIG. 23B, on the surface of the lamination layer 46, the lower layer electrode 62 composed of a conductive pattern is provided to be located substantially below the upper layer electrode 61. The via 41 connected by the antenna terminal Ant is coupled to the lamination layer 44, and the via 41 connected by the terminal L is coupled to the lamination layer 44 and to the lamination layer 46 and further coupled to the lower layer electrode 62. Accordingly, the inductor 53 and the capacitor 64 are connected in parallel with the resonator S31 through the via 41 and the wire 42.

In accordance with the fourth embodiment, it is possible to provide a MIM capacitor 64 with a package material of the stacked package 30 in which the capacitor C31 and the resonator S31 of the resonant circuit 18 is used as a dielectric material.

Fifth Embodiment

Figure 24:
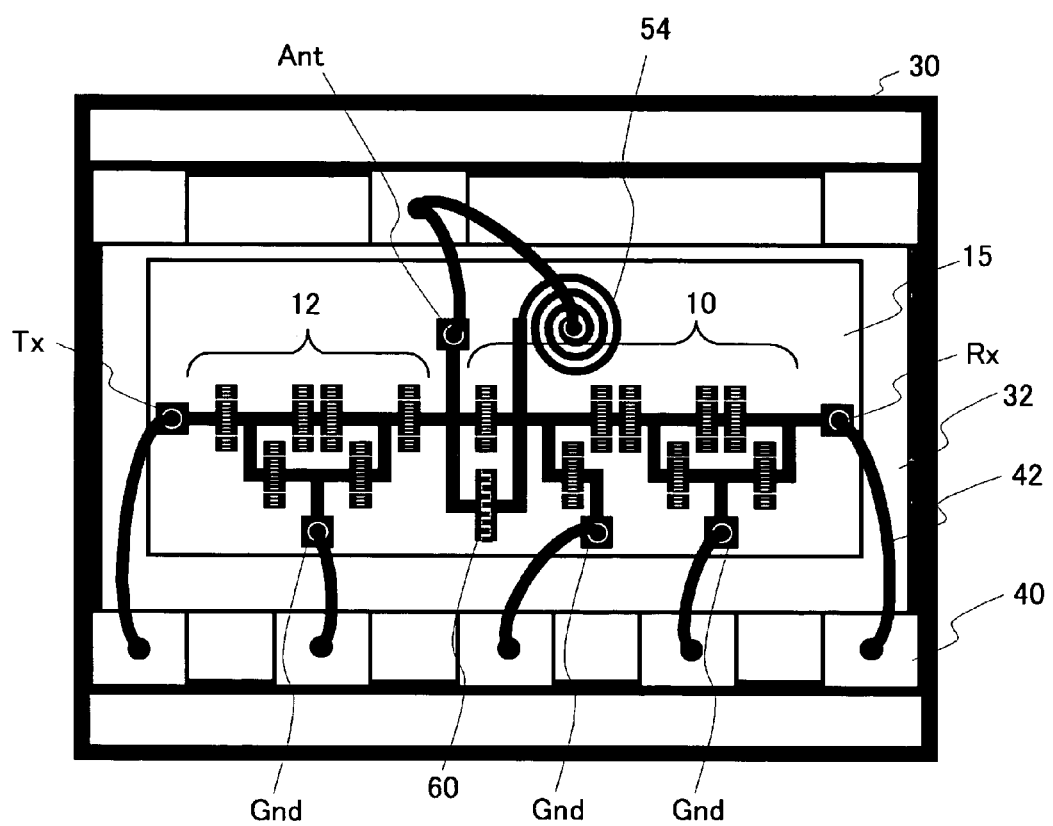
FIG. 24 is a top view of the stacked package on which the chip is mounted in accordance with a fifth embodiment of the present invention.

A fifth embodiment of the present invention is an example in which the capacitor 60 and an inductor 54 are formed in the chip 15, and the chip 15 is mounted in a face-up manner. FIG. 24 is a top view of the stacked package 30 on which the chip 15 is mounted. In the fifth embodiment, the same components and configurations as those of the third embodiment have the same reference numerals and a detailed explanation will be omitted. Referring to FIG. 24, the inductor 54 composed of a spiral coil is provided in the chip 15. One end of the inductor 54 is connected between the resonators S31 and S1, and the other end thereof is connected to the pad 40 by the wire 42, the pad 40 being connected to the antenna terminal Ant by the wire 42. Accordingly, the inductor 54 is connected in parallel with the resonator S31 through the wire 42.

In accordance with the fifth embodiment of the present invention, it is possible to form the inductor L31 of the resonant circuit 18 on an identical substrate on which the resonator S31 is formed.

Sixth Embodiment

Figure 25A:
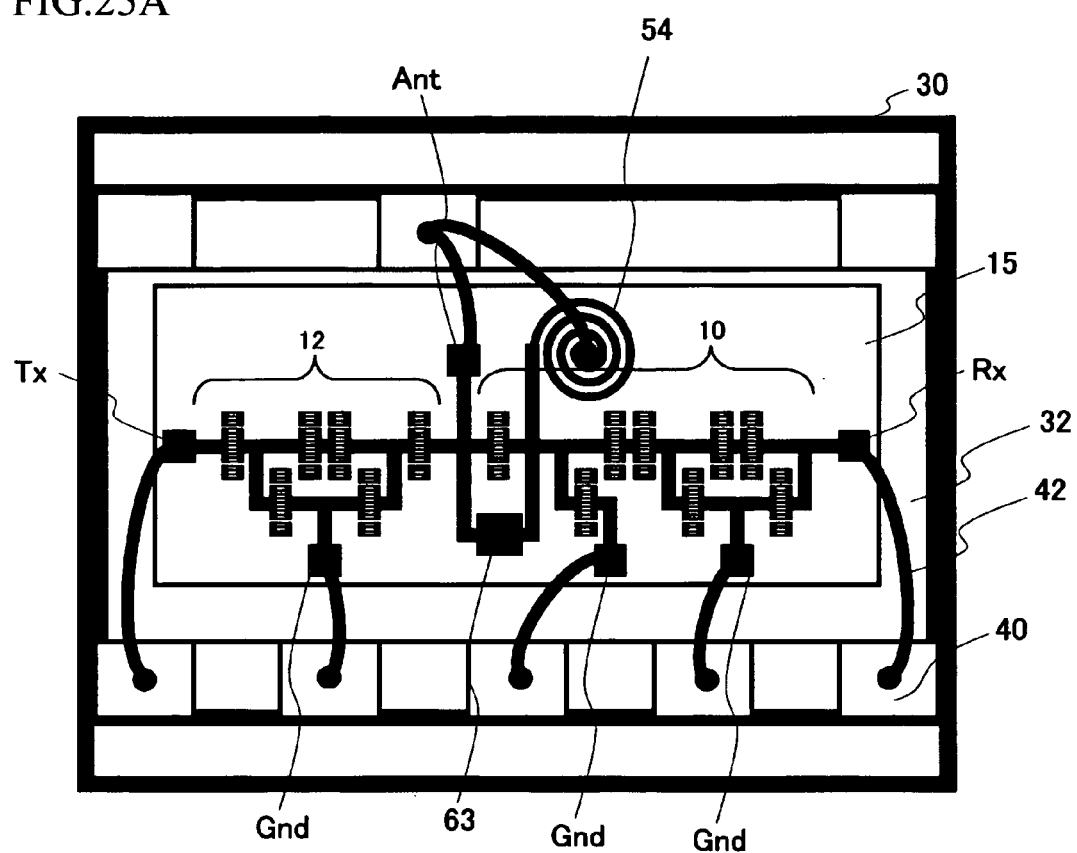
FIG. 25A is a top view of the stacked package on which the chip is mounted in accordance with a sixth embodiment of the present invention.
Figure 25B:
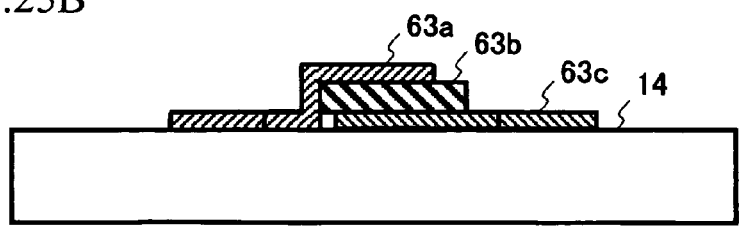
FIG. 25B is a cross-sectional view of a MIM capacitor in accordance with the sixth embodiment of the present invention.

A sixth embodiment of the present invention is an example in which a MIM capacitor 63 and the inductor 54 are formed in the chip 15, and the chip 15 is mounted in a face-up manner. FIG. 25A is a top view of the stacked package 30 on which the chip 15 is mounted. FIG. 25B is a cross-sectional view of the MIM capacitor 63. In the sixth embodiment, the same components and configurations as those of the third embodiment have the same reference numerals and a detailed explanation will be omitted. Referring to FIG. 25A, the MIM capacitor 63 is provided in parallel with the resonator S31 on the chip 15.

Referring to FIG. 25B, the MIM capacitor 63 is composed of: a lower electrode 63c made of, for example, aluminum formed on the piezoelectric substrate 14; a dielectric film 63b made of, for example, a silicon oxide film on the lower electrode 63c; and an upper electrode 63a made of aluminum formed on the dielectric film 63b.

In accordance with the sixth embodiment, it is possible to provide a MIM capacitor in which the capacitor C31 of the resonant circuit 18 is provided on an identical substrate on which and the resonator S31 is provided.

Seventh Embodiment

Figure 26:
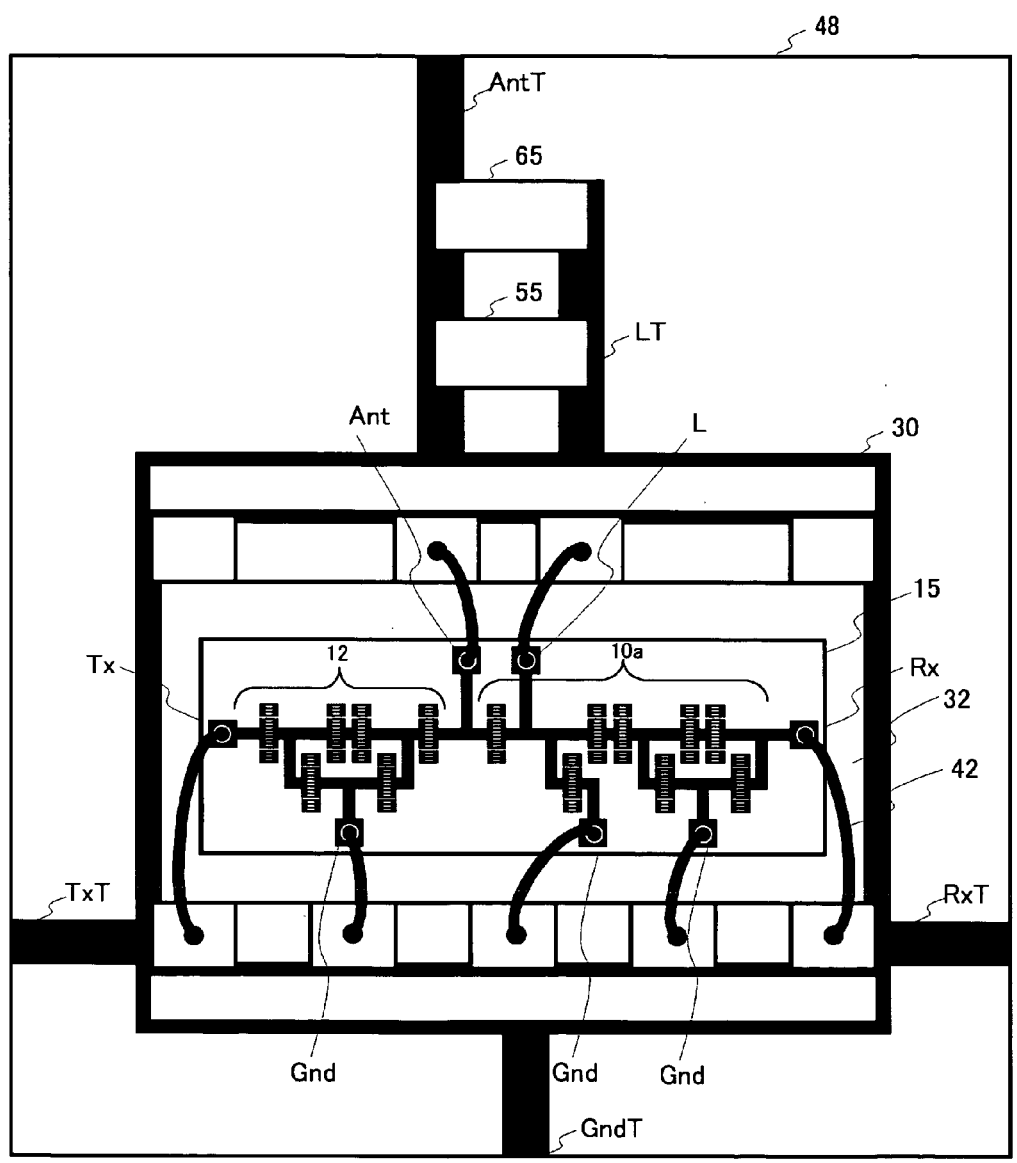
FIG. 26 is a top view of the stacked package on which the chip is mounted and a printed circuit board 48 in accordance with a seventh embodiment of the present invention.

A seventh embodiment of the present invention is an example in which a chip capacitor 65 and a chip inductor 55 are mounted on a printer circuit board on which the stacked package 30 is mounted. FIG. 26 is a top view of the stacked package 30 and the printed circuit board 48. On the stacked package 30, the chip 15 is mounted. In the seventh embodiment, the same components and configurations as those of the third embodiment have the same reference numerals and a detailed explanation will be omitted. Referring to FIG. 26, neither capacitor nor inductor is provided on the chip 15. The terminals Ant, L, Tx, Rx, and Gnd of the chip 15 are respectively connected through the vias and the footpads (not shown) in the stacked package 30, to terminals AntT, Lt, TxT, RxT, and GndT of the printed circuit board 48. Then, the chip capacitor 65 and the chip inductor 55 are connected between the terminals AntT and LT. Accordingly, the chip capacitor 65 and the chip inductor 55 are connected in parallel with the resonator S31.

In accordance with the seventh embodiment, it is possible to replace the capacitor C31 and the inductor L31 of the resonant circuit 18 with a chip capacitor or a chip inductor provided on the printed circuit board 48 (substrate) outside of the stacked package 30 on which the resonator S31 is mounted.

Eighth Embodiment

Figure 27A:
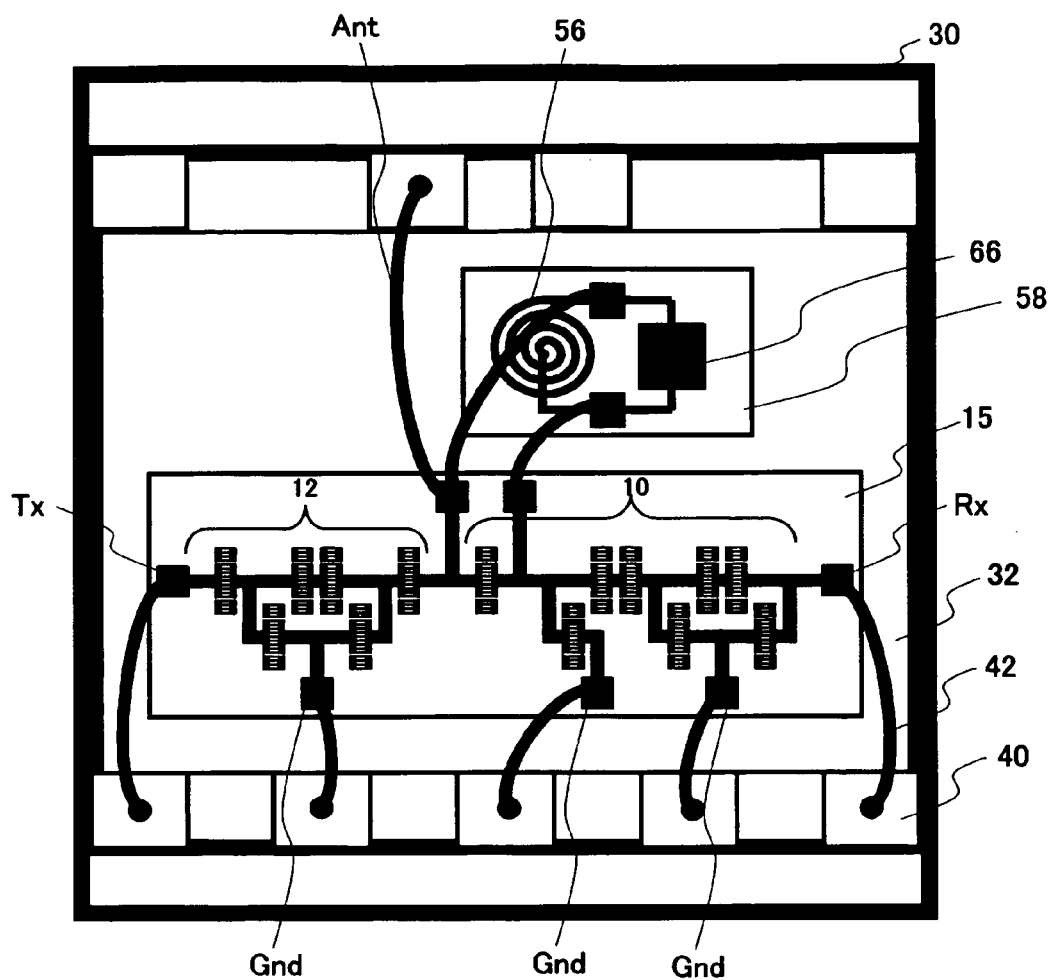
FIG. 27A is a top view of the stacked package on which the chip and an IPD chip are mounted in accordance with an eighth embodiment of the present invention.
Figure 27B:
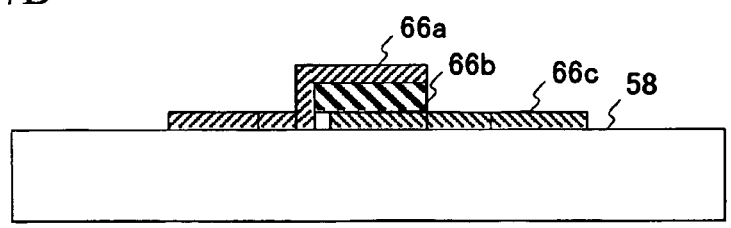
FIG. 27B is a cross-sectional view of the MIM capacitor on the IPD chip in accordance with the eighth embodiment of the present invention.

An eighth embodiment of the present invention is an example in which a capacitor 66 and an inductor 56 are mounted on an integrated passive device (IPD) chip 58. FIG. 27A is a top view of the stacked package 30 on which the chip 15 and the IPD chip 58 are mounted. FIG. 27B is a cross-sectional view of the MIM capacitor 66 on the IPD chip. In the eighth embodiment, the same components and configurations as those of the third embodiment have the same reference numerals and a detailed explanation will be omitted. Referring to FIG. 27A, neither capacitor nor inductor is provided on the chip 15. On the IPD chip 58, the inductor 56 that employs a spiral coil and the MIM capacitor 66 are connected in parallel. The chip 15 and the IPD chip 58 are connected by the wire 42. Accordingly, the inductor 56 and the capacitor 66 are connected in parallel with the resonator S31. Referring to FIG. 27B, the MIM capacitor 66 is composed of: a lower electrode 66c composed of, for example, aluminum formed on the IPD chip 58; a dielectric film 66b made of, for example, a silicon oxide film on the lower electrode 66c; and an upper electrode 66a made of aluminum formed on the dielectric film 66b.

In accordance with the eighth embodiment, it is possible to replace the capacitor C31 and the inductor L31 of the resonant circuit 18 with a capacitor and an inductor formed in the IPD chip 58 (substrate) instead of the piezoelectric substrate 14 on which the resonator S31 is provided.

In accordance with the third through eighth embodiments, in the resonant circuit 18 and the duplexer 100, the mounting area of the package 30 can be reduced while the passband characteristics of the filter is kept almost the same as those of the conventional example, in a similar manner as the first and second embodiments.

Ninth Embodiment

Figure 28:
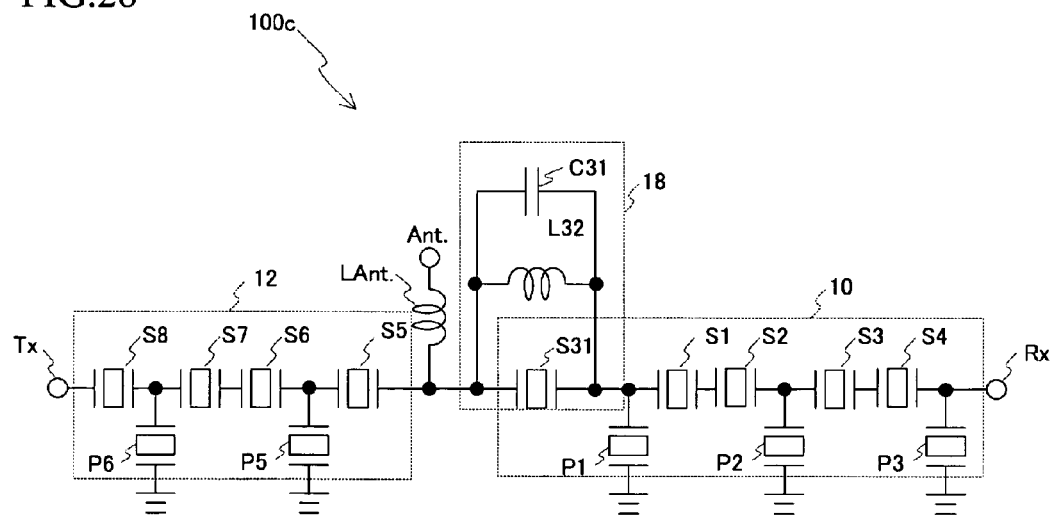
FIG. 28 is a block diagram of a duplexer in accordance with a ninth embodiment of the present invention.

FIG. 28 is a block diagram of a duplexer 100c in accordance with a ninth embodiment of the present invention. In the duplexer 100c, a matching inductor LAnt is connected in series with the antenna terminal Ant. Except the afore-described configuration, the same components and configurations as those of the second embodiment have the same reference numerals and a detailed explanation will be omitted. In accordance with the ninth embodiment, it is possible to reduce the reflection loss of the antenna terminal.

Tenth Embodiment

Figure 29:
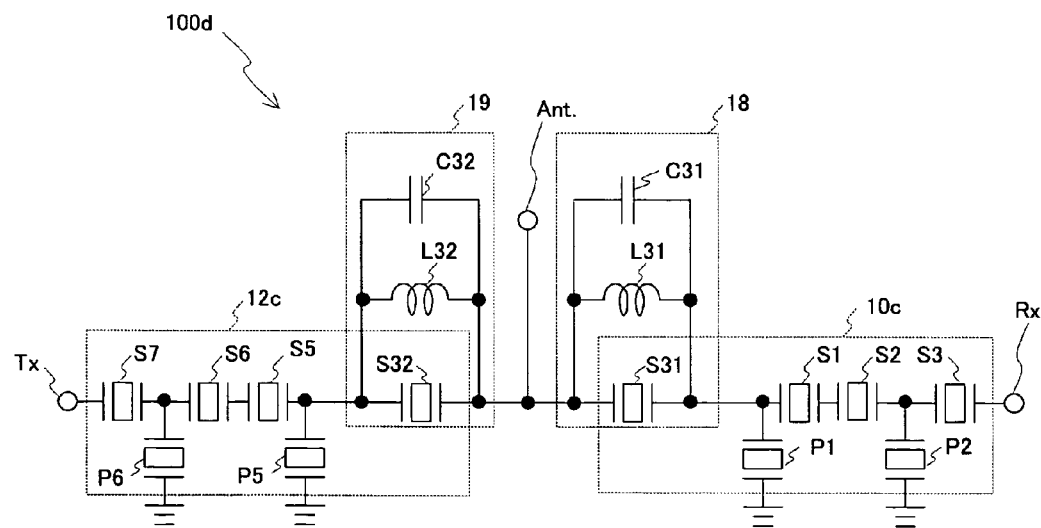
FIG. 29 is a block diagram of a duplexer in accordance with a tenth embodiment of the present invention.

FIG. 29 is a block diagram of a duplexer 100d in accordance with a tenth embodiment of the present invention. In the duplexer 100d, the resonant circuit 18 is provided on the side of the antenna terminal Ant of a receive filter 10c, and in addition, a resonant circuit 19 in which an inductor L32 and a capacitor C32 connected in parallel with a resonator S32 is also provided on the side of antenna terminal Ant of a transmit filter 12c. Except the afore-described configuration, the same components and configurations as those of the second embodiment have the same reference numerals and a detailed explanation will be omitted. The resonant circuit 19 is configured such that there is the antiresonance point (attenuation pole) in the receive bandpass. Accordingly, the resonant circuit 19 functions as a matching circuit of the duplexer, and may be used to improve the attenuation characteristic in the receive bandpass of the receive filter 12c. It is therefore possible to increase the impedance of the receive bandpass viewing from the antenna of the transmit filter 12c, and increase the impedance of the transmit bandpass viewing from the antenna of the receive filter 10c. It is possible to reduce the reflection loss of the antenna terminal. This can realize a low-loss duplexer.

Eleventh Embodiment

Figure 30:
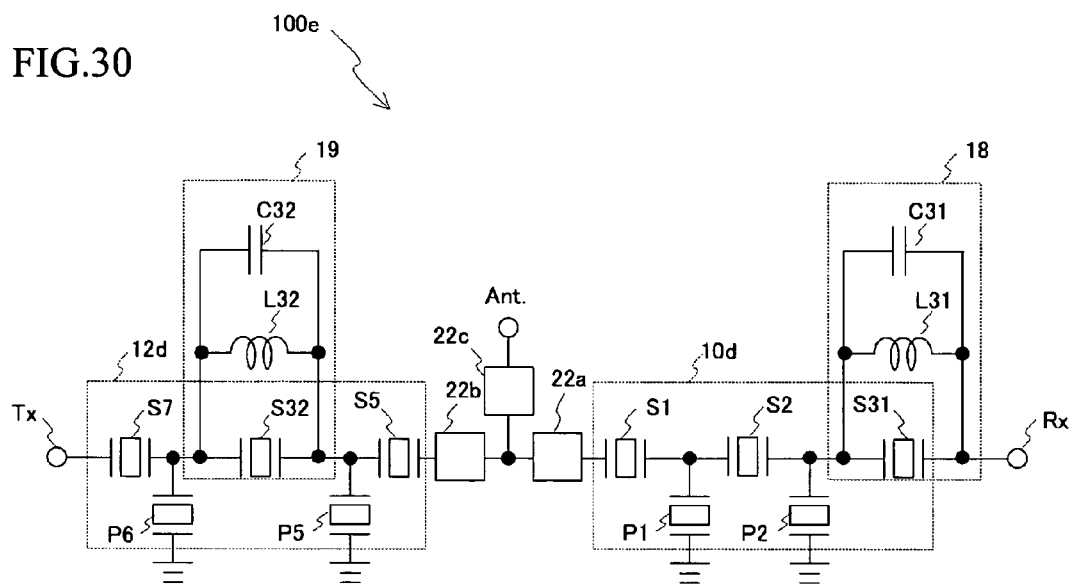
FIG. 30 is a block diagram of a duplexer in accordance with an eleventh embodiment of the present invention.

FIG. 30 is a block diagram of a duplexer 100e in accordance with an eleventh embodiment of the present invention. In the duplexer 100e, neither inductor nor capacitor is provided to the resonator on the side of the antenna terminal Ant of the receive filter 10d or that of a transmit filter 12d. The resonant circuit 18 is located on the side of the receiving terminal Rx of the receive filter 10d, and the resonant circuit 19 is located in the middle of the receive filter 10d. In addition, matching circuits 22a, 22b, and 22c are respectively connected in series between the transmit filter 12d and the antenna terminal Ant, between the transmit filter 12d and the antenna terminal Ant, and with the antenna terminal Ant. The matching circuits 22a through 22c are designed with the use of a lumped parameter circuit having an inductor or capacitor, or a distributed constant circuit having a strip line or micro strip line. In accordance with the eleventh embodiment, it is possible to set the antiresonance point (attenuation pole) separately from the demand for the matching circuit, by connecting the inductor or capacitor connected in parallel with the series resonator instead of the series resonator provided on the side of the antenna terminal Ant. Accordingly, it is possible to improve the attenuation amount of an arbitrary frequency. In addition, the inductors L31 and L32 can be reduced in size, thereby decreasing the mounting surface.

In accordance with the ninth through eleventh embodiments, at least one of the transmit filter (second filter) and the receive filter (first filter) is configured to include the resonant circuit 18 or 19 employed in the first embodiment, thereby making it possible to provide an antenna duplexer in which the mounting area is reduced and the attenuation amount can be improved at an arbitrary frequency.

Twelfth Embodiment

Figure 31:
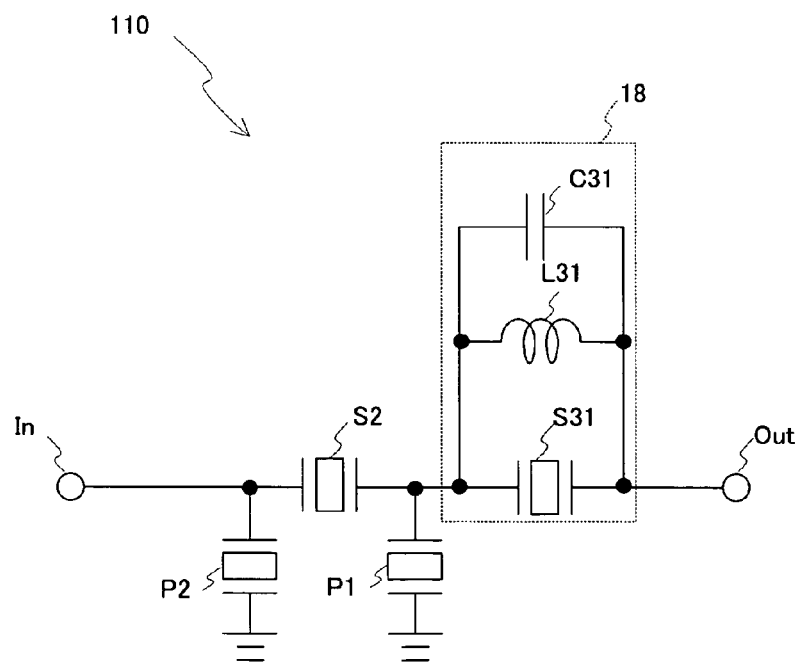
FIG. 31 is a block diagram of a ladder type filter in accordance with a twelfth embodiment of the present invention.

FIG. 31 is a block diagram of a ladder type filter 110 in accordance with a twelfth embodiment of the present invention. In the ladder type filter 110, series resonators S2 and S31 and parallel resonators P1 and P2 are provided between the input terminal In and the output terminal Out. The capacitor C31 and the inductor L31 are connected in parallel with the resonator S31. The resonator S31, the capacitor C31, and the inductor L31 compose the resonant circuit 18 employed in the first embodiment. In the ladder type filter 110, it is possible to improve the attenuation amount at an arbitrary frequency to a large degree by including the resonant circuit 18 employed in the first embodiment.

Thirteenth Embodiment

Figure 32:
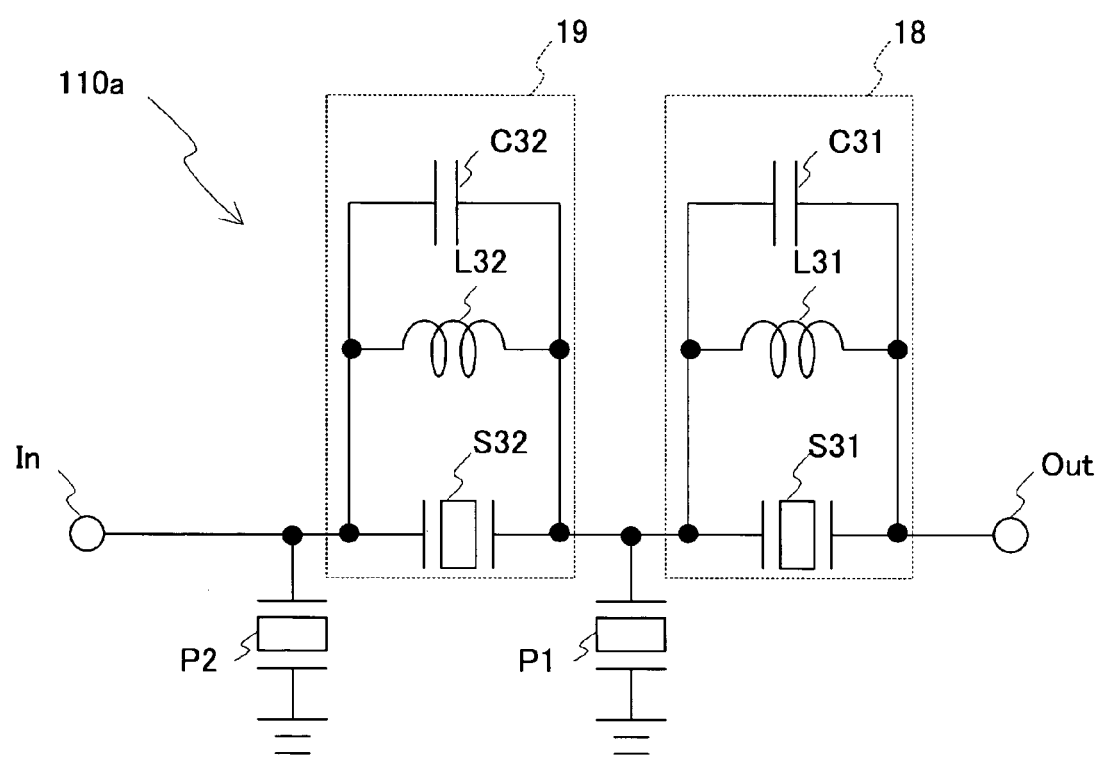
FIG. 32 is a block diagram of a ladder type filter in accordance with a thirteenth embodiment of the present invention.

FIG. 32 is a block diagram of a ladder type filter 110a in accordance with a thirteenth embodiment of the present invention. In the ladder type filter 110a, in addition to the resonant circuit 18 employed in the twelfth embodiment, the capacitor C32 and the inductor L32 are connected in parallel with a remaining series resonator S32. The resonator S32, the capacitor C32, and the inductor L32 compose the resonant circuit 19 employed in the first embodiment. Accordingly, in the ladder type filter 110a, the capacitor and the inductor are connected with all the series resonators. It is therefore possible to improve the attenuation amount at an arbitrary frequency, as compared to the filter 110 employed in the eleventh embodiment.

In accordance with the twelfth and thirteenth embodiments, in the ladder type filter, at least one of the series resonant circuits is the resonant circuit 18 employed in the first embodiment. This makes it possible to reduce the mounting area and improve the attenuation amount at an arbitrary frequency.

Further, in the second through thirteenth embodiments, a description has been given of examples in which the resonant circuit 18 used in the first embodiment is applied to the series resonant circuit of the ladder type filter. However, the resonant circuit used in the first embodiment may be applied to the parallel resonant circuit. That is to say, it is only necessary that at least one of the series resonant circuit and the parallel resonant circuit is the resonant circuit used in the first embodiment.

Fourteenth Embodiment

Figure 33A:
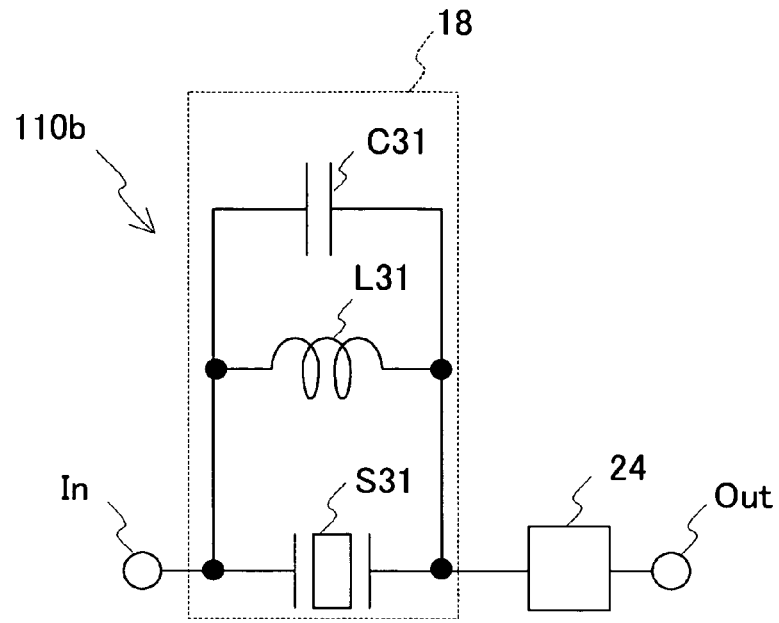
FIG. 33A is a block diagram of a filter in accordance with a fourteenth embodiment of the present invention.
Figure 33B:
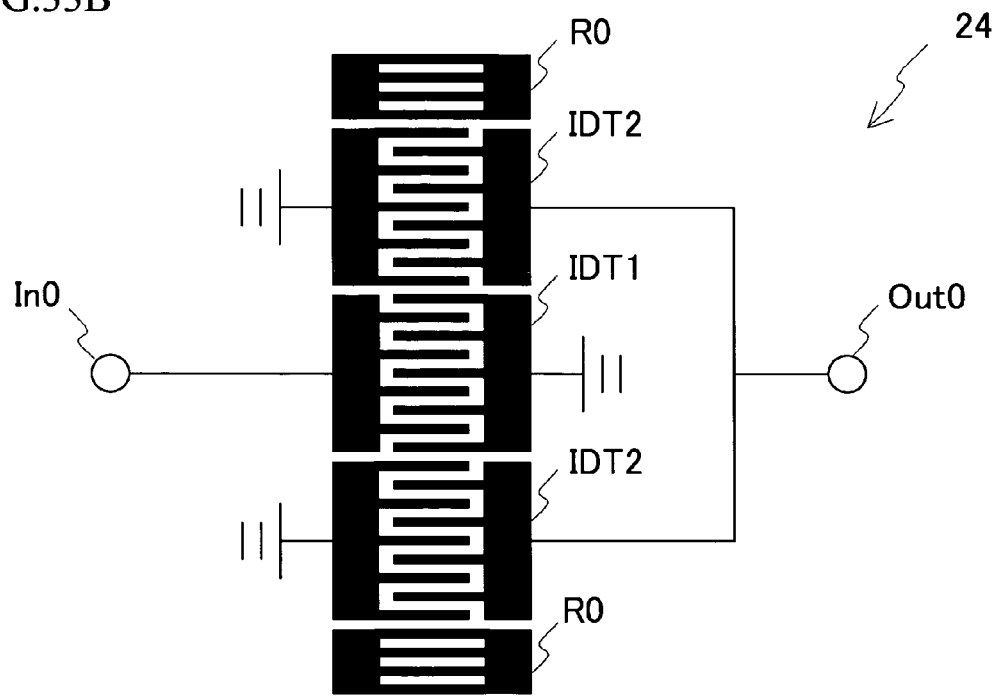
FIG. 33B is a block diagram of a DMS filter in accordance with the fourteenth embodiment of the present invention.

FIG. 33A is a block diagram of a filter 110b in accordance with a fourteenth embodiment of the present invention. In the filter 110b, a double-mode SAW (DMS) filter 24 is provided between the input terminal In and the output terminal Out, and the resonant circuit 18 used in the first embodiment is connected in series on the side of the input terminal In of the filter 24. FIG. 33B is a block diagram of the DMS filter 24. The DMS filter 24 includes: two output IDTs 2 connected between the two reflectors R0 and connected to an output terminal Out0; and one input IDT1 connected to an input terminal In0. In this manner, the resonant circuit 18 used in the first embodiment can be added to a multi-mode SAW filter. It is therefore possible to improve the attenuation amount at an arbitrary frequency in the multi-mode SAW filter.

Fifteenth Embodiment

Figure 34:
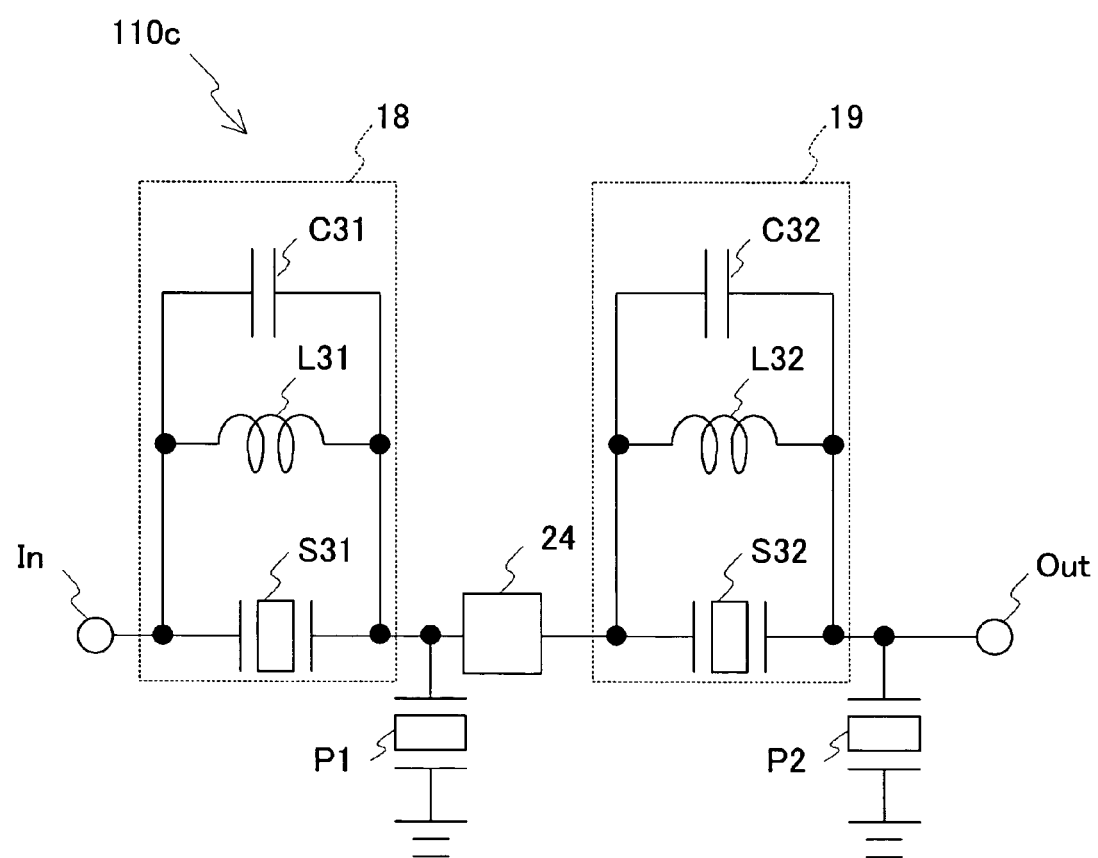
FIG. 34 is a block diagram of a filter in accordance with a fifteenth embodiment of the present invention.

FIG. 34 is a block diagram of a filter 110c in accordance with a fifteenth embodiment of the present invention. In the filter 110c, the resonant circuits 18 and 19 used in the first embodiment are connected in series at both sides of the DMS filter 24 used in the thirteenth embodiment. The resonator P1 is connected in parallel between the resonant circuit 18 and the DMS filter 24, and the resonator P2 is connected in parallel with the output terminal Out. In the multi-mode SAW filter with such configuration, the attenuation amount can be improved at an arbitrary frequency.

Sixteenth Embodiment

Figure 35A:
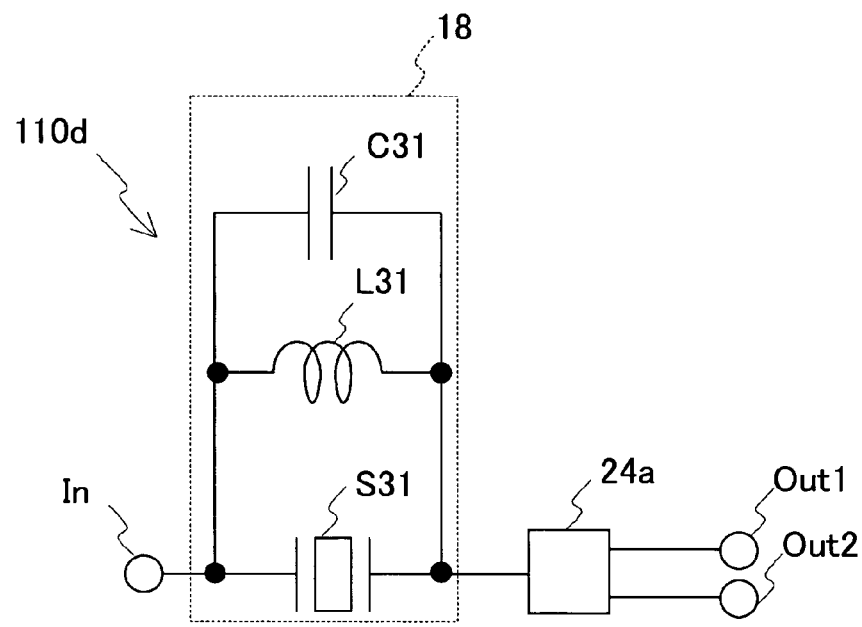
FIG. 35A is a block diagram of a filter in accordance with a sixteenth embodiment of the present invention.
Figure 35B:
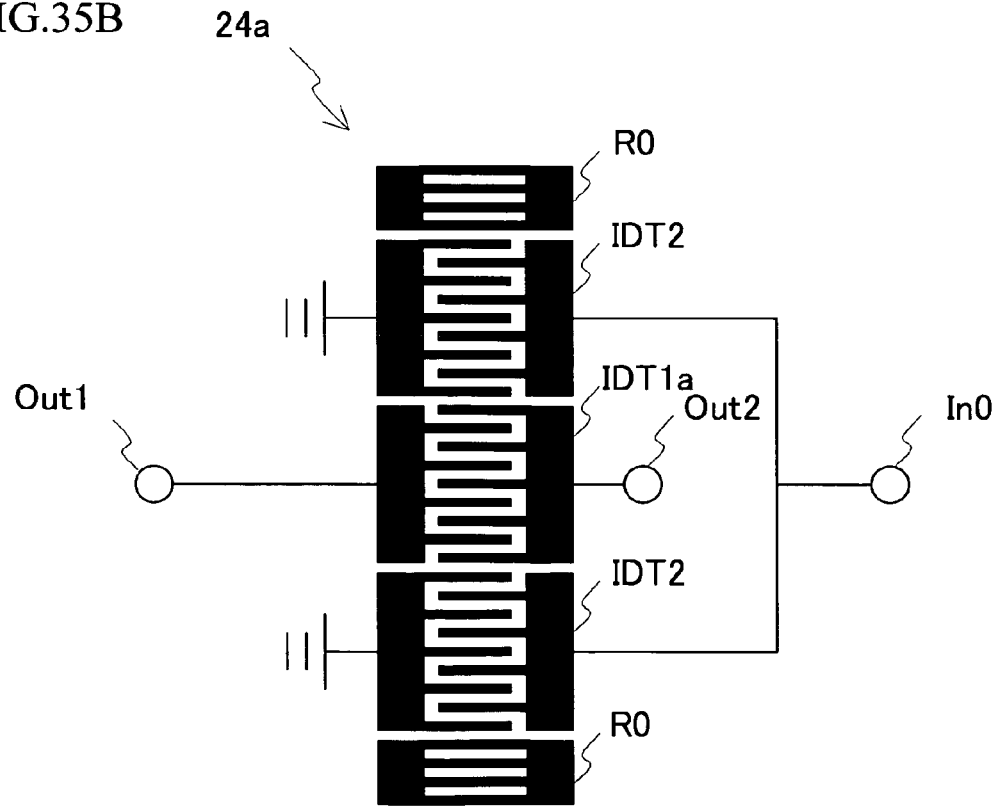
FIG. 35B is a top view of a balance type SAW filter in accordance with the sixteenth embodiment of the present invention.

FIG. 35A is a block diagram of a filter 110d in accordance with a sixteenth embodiment of the present invention. In the filter 110d, the resonant circuits 18 and 19 employed in the first embodiment are connected in series at the side of the input terminal In of a balance type DMS filter 24a connected to output terminals Out1 and Out2. FIG. 35B is a block diagram of the balance type DMS filter 24a. The DMS filter 24a includes: an output IDT1a provided between the two reflectors R0 and connected to output terminals Out1 and Out2; and two output IDTs 2 connected to the input terminal In0. Phase-inverted signals are output at output terminals Out1 and Out2, so as to serve as a balance type DMS filter. In the balance type multi-mode SAW filter with such configuration, the attenuation amount can be improved at an arbitrary frequency.

In accordance with the filters employed in the fourteenth through sixteenth embodiments, the mounting area can be reduced, and the attenuation amount can be improved at an arbitrary frequency, by including the multi-mode SAW filter and the resonant circuit 18 employed in the first embodiment.

In the first through thirteenth embodiments, a description has been given of an example in which the SAW resonator is used for the resonator. However, a piezoelectric thin-film resonator may be employed. In such case, it is possible to obtain the same effects as those in the first through twelfth embodiments.

The present invention is not limited to the above-mentioned embodiments, and other embodiments, variations and modifications may be made without departing from the scope of the present invention.

The present invention is based on Japanese Patent Application No. 2005-219254 filed on Jul. 28, 2005, the entire disclosure of which is hereby incorporated by reference.

What is claimed is:

1. An antenna duplexer comprising:
an antenna terminal;
a receive filter and a transmit filter that are connected to the antenna terminal, the receive filter being a ladder type filter and the transmit filter being a ladder type filter;
a resonator connected between the receive filter and the antenna terminal;

an inductor connected in parallel with only the resonator; and a capacitor connected in parallel with only the resonator;
wherein the capacitor has a capacitance value equal to or more than 0.2 times a capacitance value of the resonator.

2. The antenna duplexer as claimed in claim 1, wherein the resonator is either a surface acoustic wave resonator or a piezoelectric thin-film resonator.

3. The antenna duplexer as claimed in claim 1, wherein at least one of the capacitor and the inductor is formed on an identical substrate on which the resonator is formed.

4. The antenna duplexer as claimed in claim 3, wherein the capacitor is a surface acoustic wave interdigital transducer.

5. The antenna duplexer as claimed in claim 3, wherein the capacitor is a MIM capacitor.

6. The antenna duplexer as claimed in claim 1, wherein the capacitor is a MIM capacitor having a dielectric material that is shared with a material of a package on which the resonator is mounted.

7. The antenna duplexer as claimed in claim 1, wherein at least one of the capacitor and the inductor is formed on a substrate different from the substrate on which the resonator is formed.

8. The antenna duplexer as claimed in claim 1, wherein at least one of the capacitor and the inductor is a chip capacitor or a chip inductor provided outside of a package on which the resonator is mounted.

9. The antenna duplexer as claimed in claim 1, wherein the inductor is formed as a line pattern in a package on which the resonator is mounted.

* * * * *

UNITED STATES PATENT AND TRADEMARK OFFICE
CERTIFICATE OF CORRECTION

| | | |
|---|---|---|
| PATENT NO. | : 7,683,736 B2 | Page 1 of 1 |
| APPLICATION NO. | : 11/493655 | |
| DATED | : March 23, 2010 | |
| INVENTOR(S) | : Shogo Inoue et al. | |

It is certified that error appears in the above-identified patent and that said Letters Patent is hereby corrected as shown below:

Title Page:

Item (75) Inventors:

Please delete

"Mosanori UEDA"

And insert

-- Masanori UEDA --

Signed and Sealed this

Eighteenth Day of May, 2010

David J. Kappos
*Director of the United States Patent and Trademark Office*